United States Patent
Ozdemir

(10) Patent No.: US 7,290,200 B2
(45) Date of Patent: Oct. 30, 2007

(54) $E^2PR4$ VITERBI DETECTOR AND METHOD FOR ADDING A BRANCH METRIC TO THE PATH METRIC OF THE SURVIVING PATH AFTER SELECTING THE SURVIVING PATH

(75) Inventor: Hakan Ozdemir, San Jose, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 266 days.

(21) Appl. No.: 10/194,660

(22) Filed: Jul. 12, 2002

(65) Prior Publication Data

US 2004/0010749 A1   Jan. 15, 2004

(51) Int. Cl.
*H03M 13/03* (2006.01)

(52) U.S. Cl. .................. 714/795; 714/796; 375/262

(58) Field of Classification Search ................ 714/795, 714/796; 375/262
See application file for complete search history.

(56) References Cited

U.S. PATENT DOCUMENTS

| | | | |
|---|---|---|---|
| 5,313,495 A * | 5/1994 | Kim | 375/341 |
| 5,375,129 A * | 12/1994 | Cooper | 714/795 |
| 5,430,744 A | 7/1995 | Fettweis et al. | |
| 5,940,416 A * | 8/1999 | Nishiya et al. | 714/795 |
| 6,081,210 A * | 6/2000 | Nikolic et al. | 341/59 |
| 6,201,840 B1 * | 3/2001 | Rub et al. | 375/341 |
| 6,216,249 B1 * | 4/2001 | Bliss et al. | 714/792 |
| 6,236,692 B1 * | 5/2001 | Keirn | 375/341 |
| 6,259,749 B1 * | 7/2001 | Andoh | 375/341 |
| 6,343,103 B1 * | 1/2002 | Lou et al. | 375/261 |
| 2004/0010748 A1 * | 1/2004 | Ozdemir | 714/795 |

* cited by examiner

*Primary Examiner*—Joseph D. Torres
(74) *Attorney, Agent, or Firm*—Lisa K. Jorgenson; Bryan A. Santarelli

(57) ABSTRACT

An $E^2PR4$ Viterbi detector includes a recovery circuit and receives a signal that represents a sequence of values, the sequence having a potential state. The recovery circuit recovers the sequence from the signal by identifying a surviving path to the potential state and, after identifying the surviving path, adding a modified branch metric to the path metric of the surviving path to generate an updated path metric for the potential state. Updating the path metric of the surviving path after the surviving path is selected allows the $E^2PR4$ Viterbi detector to be smaller and/or faster than an $E^2PR4$ Viterbi detector that updates the path metric before selecting the surviving path.

24 Claims, 16 Drawing Sheets

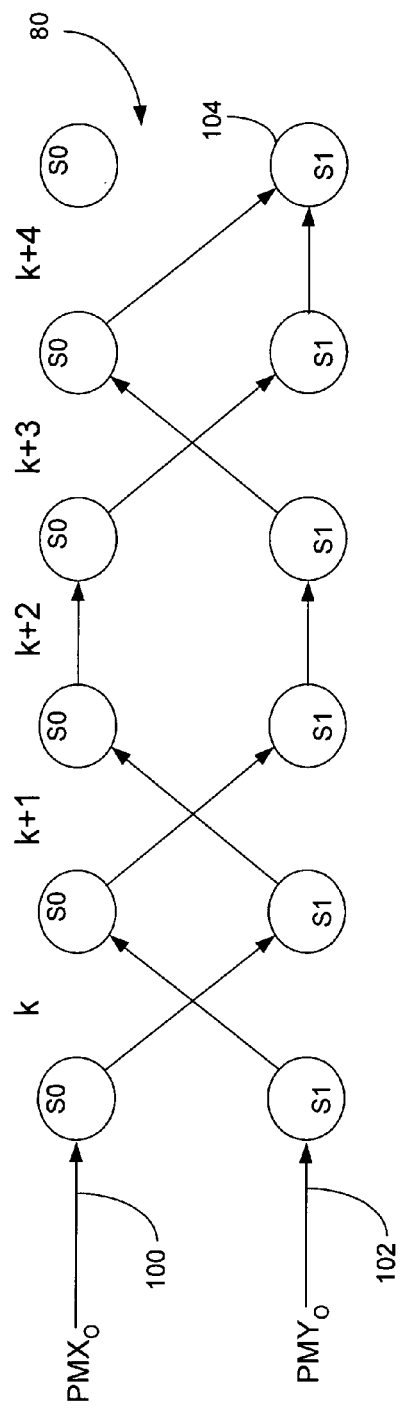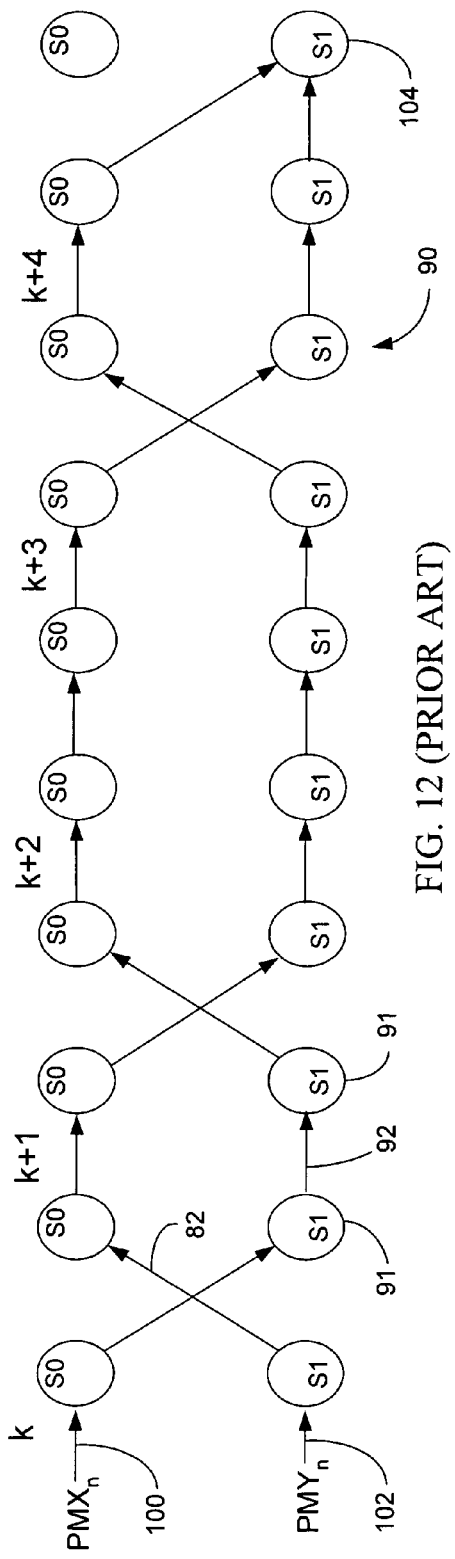
FIG. 11 (PRIOR ART)
FIG. 12 (PRIOR ART)

E²PR4 VITERBI DETECTOR AND METHOD FOR ADDING A BRANCH METRIC TO THE PATH METRIC OF THE SURVIVING PATH AFTER SELECTING THE SURVIVING PATH

CROSS-RELATED APPLICATION

This application is cross-related to application Ser. No. 10/194,659 entitled "E²PR4 VITERBI DETECTOR AND METHOD FOR ADDING A BRANCH METRIC TO THE PATH METRIC OF THE SURVIVING PATH WHILE SELECTING THE SURVIVING PATH", which was filed on the same day as the present application and which is incorporated by reference.

BACKGROUND

Viterbi detectors are used in many of today's data receivers to recover digital data from samples of a data signal having a relatively low signal-to-noise ratio (SNR). For example, Viterbi detectors are used in disk-drive read channels to recover the sequence of data values read from a magnetic disk, and are used in cell phones to recover the sequence of data values from a digitized voice signal. Basically, a Viterbi detector considers all of the possible data-value sequences that the data signal can represent and determines from the samples of the data signal which of the possible sequences is most likely to be the correct, i.e., surviving, sequence. Because the complexity of the Viterbi detector is independent of the length of the recovered sequence, it has proven to be one of the most effective circuits for recovering digital-data sequences from signals having relatively low SNRs.

Unfortunately, as discussed below, the add-compare-select (ACS) algorithm that many Viterbi detectors implement often requires fast circuitry having a relatively large number of transistors so that such a Viterbi detector does not unduly limit the rate at which a receiver can process received data. Such a Viterbi detector executes the ACS algorithm for each data-signal sample or group of data-signal samples, and must finish executing the algorithm for one sample or group of samples before moving on to the next sample or sample group. Consequently, the rate at which the receiver samples the data signal and recovers data therefrom is limited to the speed at which the Viterbi detector can execute the ACS algorithm. Unfortunately, the ACS algorithm includes a relatively large number of steps that require a relatively long time for the Viterbi detector to execute. To speed up execution of the ACS algorithm, one can design the Viterbi detector to include fast circuitry that performs many of these steps in parallel. But such circuitry typically includes a relatively large number of transistors that increase the layout area, and thus the cost, of the Viterbi detector.

And although engineers have discovered a compare-select-add (CSA) algorithm that allows a Viterbi detector to have fewer transistors than or to be faster than a Viterbi detector that executes the ACS algorithm, one cannot implement the CSA algorithm in an E²PR4 Viterbi detector.

Referring to FIGS. 1-12, an E²PR4 Viterbi detector, the ACS algorithm, and the CSA algorithm are discussed in more detail. Although this discussion does not include a general overview of the operation of a Viterbi detector, U.S. patent application Ser. No. 09/409,923, entitled "PARITY-SENSITIVE VITERBI DETECTOR AND METHOD FOR RECOVERING INFORMATION FROM A READ SIGNAL", filed Sep. 30, 1999, includes such an overview and is incorporated by reference.

FIG. 1 is a trellis diagram 10 for a conventional one-sample-at-a-time, i.e., full-rate, E²PR4 Viterbi detector (FIG. 2) that can recover a sequence of binary values from a data signal. The E²PR4 channel is represented by the following discrete-time transfer polynomial:

$$1+2D-2D^3-D^4 \quad (1)$$

where D represents a delay of one sample period, $D^3$ represents a delay of three sample periods, and $D^4$ represents a delay of four sample periods. Therefore, the sample $Y_k$ of a data signal at a sample time k has an ideal (no noise) value that is given by the following equation:

$$Y_k = X_k + 2X_{k-1} - 2X_{k-3} - X_{k-4} \quad (2)$$

where $X_k$ is the binary value of the data signal at sample time k, $X_{k-1}$ is the binary value at sample time k−1, etc. Because each sample Y is calculated from four binary values X, the sequence of binary values X has one of $4^2=16$ potential states S0-S15 for each sample time k. Two respective branches 20 (e.g., 20a, 20b, 20c, and 20d) originating from two states S prior to sample time k each terminate at respective states S after the sample time k. For example, the branches 20a and 20b originate at S0 and S8 prior to time k, respectively, and terminate at S0 after time k. Table I includes the ideal sample values Y and the L2 branch metrics as a function of Y for each of the branches 20.

TABLE I

| Branch 20 | Ideal Sample Value Y | L2 Branch Metric |
|---|---|---|
| S0 to S0 | +0 | 0 |
| S0 to S1 | +1 | 1 − 2Y |
| S1 to S2 | +2 | 4 − 4Y |
| S1 to S3 | +3 | 9 − 6Y |
| S2 to S4 | 0 | 0 |
| S2 to S5 | +1 | 1 − 2Y |
| S3 to S6 | +2 | 4 − 4Y |
| S3 to S7 | +3 | 9 − 6Y |
| S4 to S8 | −2 | 4 + 4Y |
| S4 to S9 | −1 | 1 + 2Y |
| S5 to S10 | 0 | 0 |
| S5 to S11 | +1 | 1 − 2Y |
| S6 to S12 | −2 | 4 + 4Y |
| S6 to S13 | −1 | 1 + 2Y |
| S7 to S14 | 0 | 0 |
| S7 to S15 | 1 | 1 − 2Y |
| S8 to S0 | −1 | 1 + 2Y |
| S8 to S1 | 0 | 0 |
| S9 to S2 | +1 | 1 − 2Y |
| S9 to S3 | +2 | 4 − 4Y |
| S10 to S4 | −1 | 1 + 2Y |
| S10 to S5 | 0 | 0 |
| S11 to S6 | +1 | 1 − 2Y |
| S11 to S7 | +2 | 4 − 4Y |
| S12 to S8 | −3 | 9 + 6Y |
| S12 to S9 | −2 | 4 + 4Y |
| S13 to S10 | −1 | 1 + 2Y |
| S13 to S11 | 0 | 0 |
| S14 to S12 | −3 | 9 + 6Y |
| S14 to S13 | −2 | 4 + 4Y |
| S15 to S14 | −1 | 1 + 2Y |
| S15 to S15 | 0 | 0 |

FIG. 2 is a block diagram of a conventional full-rate E²PR4 Viterbi detector 40 that operates according to the trellis diagram 10 (FIG. 1) and that includes an add-compare-select unit (ACSU) 42 for implementing the ACS algorithm. In addition to the ACSU 42, the detector 40 includes a branch-metric unit (BMU) 44 and a survivor-memory unit (SMU) 46. The BMU 44 receives the samples Yk—a finite-impulse-response (FIR) filter (not shown) may process these samples before the BMU receives them—and calculates the L2 branch metrics (Table I) for the branches 20 (FIG. 1). Next, the ACSU 42 adds the branch metrics to the respective path metrics stored in the SMU 46 to update the path metrics. Then, for each potential state S0-S15, the ASCU 42 compares the updated path metrics of the two paths terminating at each state S and selects as the surviving path to S the path having the smallest updated path metric. This adding, comparing, and selecting are the general steps of the ACS algorithm discussed above. Next, for each state S0-S15, the SMU 46 stores the respective surviving path and its path metric. The Viterbi detector 40 repeats this process for each subsequent sample Yk. After a predetermined latency, the surviving paths of all the states S0-S15 converge to a single path that the SMU 46 provides as the binary values recovered from the sampled data signal.

Still referring to FIG. 2, the ACSU 42 typically includes relatively large number of transistors, and thus occupies a significant area of the integrated circuit (not shown) that includes the $E^2PR4$ Viterbi detector 40. Because the tasks that the BMU 44 and SMU 46 implement are relatively simple, the BMU and SMU typically include relatively few transistors, and thus occupy a relatively small area of the integrated circuit. Conversely, as discussed above, the ACS algorithm is relatively complex. Consequently, to avoid becoming the "bottle neck" of the Viterbi detector 40, the ACSU 42 typically includes relatively fast circuitry so that it can execute the ACS algorithm in the same or approximately the same amount of time that it takes the BMU 44 and the SMU 46 to perform their respective tasks. But to make the ACSU 42 fast, one typically designs the ACSU circuitry to execute operations in parallel. Unfortunately, such processing typically requires a relatively large number of transistors.

FIGS. 3-12 illustrate the derivation and implementation of a compare-select-add (CSA) algorithm, which allows one to replace some Viterbi detectors' ACSU with a CSA unit (not shown) that is faster than and/or has significantly fewer transistors than the ACSU 42. The CSA algorithm is further discussed in U.S. Pat. No. 5,430,744, which is incorporated by reference.

Unfortunately, there is no such CSA unit available to replace the ACSU 42 of the full-rate $E^2PR4$ Viterbi detector 40 (FIG. 2).

FIGS. 3 and 4 illustrate the derivation of the CSA algorithm from the distributive law of mathematics.

Referring to FIG. 3, two branches 70 and 72 terminate at state S and have path metrics M and N and branch metrics m and n, respectively. As discussed above in conjunction with FIG. 2, the ACSU 42 calculates M+m and N+n, compares M+m to N+n to determine which is smaller, and then selects the smallest as the surviving path metric and selects the corresponding path as the surviving path. Therefore, a branch 74 that originates from the state S has a path metric Q=min(M+m, N+n).

Referring to FIG. 4, the distributive law allows one to subtract the same value from each of the branch metrics m and n and add this same value back to the path metric Q to achieve the same result as in FIG. 3. For example, a modified Viterbi detector (not shown) subtracts z from the branch metrics m and n. The Viterbi detector calculates M+m−z and N+n−m to update the path metric, compares M+m−z to N+n−z to determine which is smaller, and then selects the smallest as the surviving path metric S and selects the corresponding path as the surviving path. Therefore, the branch 74 would have a path metric Q=min(M+m−z, N+n−z). But adding z to Q yields Q=min(M+m, N+n), which is the same result as in FIG. 3.

Still referring to FIG. 4, by choosing z appropriately, one can reduce the complexity of a Viterbi detector significantly by effectively converting its ACSU into a compare-select-add unit (CSAU) (not shown in FIG. 4). The "trick" is to select z so that the modified branch metrics m−z and n−z are constants. As long as the modified branch metrics are constant, their addition to the path metrics M and N can be hardwired into the CSAU, which simplifies the circuitry. Consequently, the CSAU can compute M+m−z and N+n−z with an implicit hardwired adding step, compare M+m−z and N+n−z, and then add z back to the minimum of M+m−z and N+n−z.

FIGS. 5-10 illustrate how one can apply the distributive law discussed above in conjunction with FIGS. 3-4 to a simple butterfly trellis so that he can simplify a corresponding Viterbi detector by replacing its ACSU with a CSAU.

FIG. 5 is a conventional butterfly trellis 80 having four branches 82 (e.g., 82a, 82b, 82c, and 82d) per sample time k. The branches 82 have respective branch metrics $a_k$, $b_k$, $c_k$, and $d_k$.

FIG. 6 is a split-state butterfly trellis 90, which, as will become more evident below, corresponds more closely to the CSA algorithm than the trellis 80 of FIG. 5. To derive the trellis 90 from the trellis 80, one first splits each state S0 and S1 into two nodes 91 (e.g., 91a, 91b, 91c, and 91d) connected by a branch 92. Then one shifts the trellis so that the branches 92 (e.g., 92a, 92b, 92c, 92d, 92e, and 92f) are aligned with the sampling times k. This splitting of the states and shifting of the trellis reflects that the addition step of the CSA algorithm occurs after the comparing and selecting steps. To distinguish the branches 82 from the branches 92, the branches 82 and 92 are called inner and outer branches, respectively.

FIGS. 7-9 illustrate the step-by-step application of the distributive law of mathematics (FIGS. 3-4) to the trellis 90 (FIG. 6) to generate modified branch metrics that allow a Viterbi detector to include a CSAU instead of an ACSU. Because application of the distributive law effectively moves branch metrics from one side of a state node to the other side, modifying the trellis 90 in such a manner is called branch shifting. For example, in FIG. 8, $a_k$ is shifted from the branches 82a and 82b to the branch 92a. To accomplish this shift, one adds $a_k$ to the branch metric of the branch 92a and subtracts $a_k$ from the branch metrics of the branches 82a and 82b. $c_k$ is shifted to the branch 92b in a similar manner.

FIG. 10 is the resulting branch-shifted trellis diagram 90. As stated above in conjunction with FIGS. 3 and 4, one can significantly simplify the CSAU if the modified branch metrics for the inner branches 82 are constants. Here, the modified branch metrics for the branches 82a-82c equal zero, so one can simplify the CSAU if the modified branch metric for the branch 82d, $a_k-b_k-c_k+d_k$, is a constant.

Referring to FIGS. 11 and 12, the branch-shifted trellis 90 (FIG. 10) gives the same data-recovery results as the trellis 80 (FIG. 5). Specifically, the path metrics $PMX_n$ and $PMY_n$ of respective converging paths 100 and 102 through the trellis 90 of FIG. 12 have the same relationship to one another as do the path metrics $PMX_o$ and $PMY_o$ of the same paths 100 and 102 through the trellis 80. That is, if $PMX_o > PMY_o$, then $PMX_n > PMY_n$, and if $PMX_o < PMY_o$, then $PMX_n < PMY_n$. As long as this relationship is retained, $PMX_n$ need not equal $PMX_o$, and $PMY_n$ need not equal $PMY_o$ for a Viterbi detector that includes a CSAU to operate properly. Furthermore, the branches 82 and 92 that do not lie along the paths 100 and 102 are omitted from FIGS. 11-12 for clarity.

Referring to FIG. 11, using the branch metrics of FIG. 5 and assuming that the path metrics $PMX_o$ and $PMY_o$ for the paths 100 and 102 have values of zero prior to sample time k, $PMX_o$ and $PMY_o$ at the convergence state 104 are given by the following equations:

$$PMX_o = b_k + c_{k+1} + a_{k+2} + b_{k+3} + d_{k+4} \qquad 4)$$

$$PMY_o = c_k + b_{k+1} + d_{k+2} + c_{k+3} + b_{k+4} \qquad 5)$$

Similarly, referring to FIG. 12, using the modified branch metrics of FIG. 10 and assuming that the path metrics $PMX_n$ and $PMY_n$ for the paths 100 and 102 have values of zero prior to sample time k, $PMX_n$ and $PMX_n$ at the convergence state 104 are given by the following equations:

$$PMX_n = a_k - a_k + b_k + c_{k+1} + a_{k+2} + a_{k+3} - a_{k+3} + b_{k+3} + c_{k+4} + a_{k+4} - b_{k+4} - c_{k+4} + d_{k+4} \qquad 6)$$

$$PMX_n = c_k + a_{k+1} - a_{k+1} + b_{k+1} + c_{k+2} + a_{k+2} - b_{k+2} - c_{k+2} + d_{k+2} - a_{k+2} + b_{k+2} + c_{k+3} + a_{k+4} \qquad 7)$$

Canceling common terms, one obtains:

$$PMX_n = b_k + c_{k+1} + a_{k+2} + b_{k+3} + a_{k+4} - b_{k+4} + d_{k+4} \qquad 8)$$

$$PMX_n = c_k + b_{k+1} + d_{k+2} + c_{k+3} + a_{k+4} \qquad 9)$$

It is well known that if A>B, then A+C>B+C, and if A<B, then A+C<B+C. Therefore, if both $PMX_n$ and $PMY_n$ respectively differ from $PMX_o$ and $PMY_o$ by the same value C, then the relationship between $PMX_n$ and $PMX_n$ is the same as the relationship between $PMX_o$ and $PMY_o$. That is, if $PMX_o > PMY_o$, then $(PMX_o + C = PMX_n) > (PMY_o + c = PMY_n)$. Likewise, if $PMX_o < PMY_o$, then $(PMX_o + C = PMX_n) < (PMY_o + C = PMY_n)$. Here, referring to equations (4), (5), (8), and (9), $C = a_{k+4} - b_{k+4}$. Consequently, the branch-shifted trellis 90 preserves the relationships between the path metrics with respect to the trellis 80, and is thus mathematically equivalent to the trellis 80.

Unfortunately, the above-described branch-shifting technique does not allow one to replace the ACSU 42 (FIG. 2) of the $E^2PR4$ Viterbi detector 40 (FIG. 2) with a smaller and/or faster CSAU. As discussed above in conjunction with FIGS. 3-10, a smaller and/or faster CSAU is typically possible only when the modified branch metrics of the inner branches 82 (FIG. 10) are constants. U.S. Pat. No. 5,430,744 discloses a branch-shifting technique that generates constant branch metrics for the inner branches of full-rate PR4 and EPR4 trellises. But unfortunately, there is no known branch-shifting technique that generates constant branch metrics for all of the inner branches of an $E^2PR4$ Viterbi detector.

SUMMARY

One embodiment of the invention is an $E^2PR4$ Viterbi detector that includes a recovery circuit and that receives a signal that represents a sequence of values, the sequence having one or more potential states. The recovery circuit recovers the sequence from the signal by identifying a surviving sequence path to the potential state and, after identifying the surviving path, adding a modified branch metric to the path metric of the surviving path to generate an updated path metric for the potential state.

Updating the path metric of the surviving path after the surviving path is selected allows the $E^2PR4$ Viterbi detector to be smaller and/or easier than an $E^2PR4$ Viterbi detector that updates the path metric before selecting the surviving path.

BRIEF DESCRIPTION OF THE DRAWINGS

FIG. 11 illustrates two paths through the butterfly trellis of FIG. 5.

FIG. 12 illustrates the same two paths through the branch-shifted butterfly trellis of FIG. 10.

DESCRIPTION OF THE EMBODIMENTS OF THE INVENTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Referring to FIGS. 13-19, the inventor has discovered a branch-shifting technique that allows a half-rate E²PR4 Viterbi detector to incorporate a CSAU that is faster and/or includes fewer transistors than an ACSU.

Figure 2:
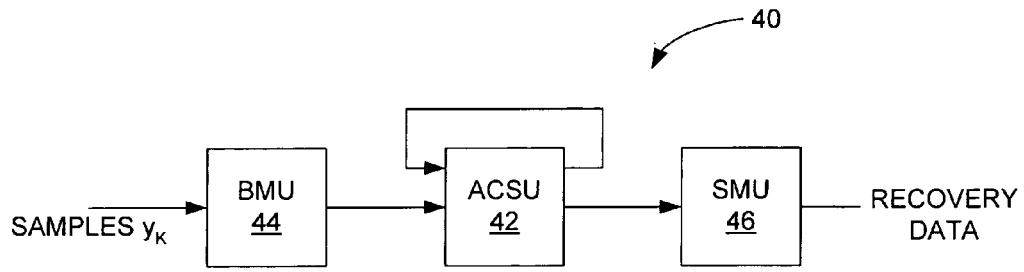
FIG. 2 is a block diagram of a conventional full-rate $E^2PR4$ Viterbi detector.
Figure 3:
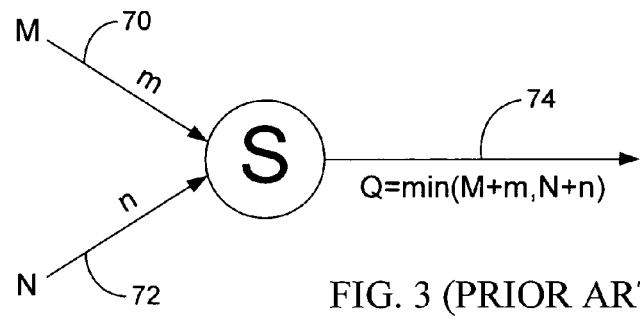
FIG. 3 is a state diagram that shows selection of a surviving outgoing path from multiple incoming branches having conventional branch metrics.
Figure 4:
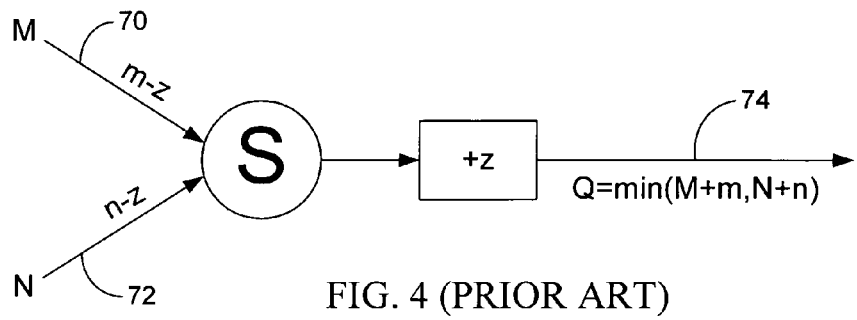
FIG. 4 is the state diagram of FIG. 3 where the incoming branches and the outgoing path have shifted branch metrics.
Figure 5:
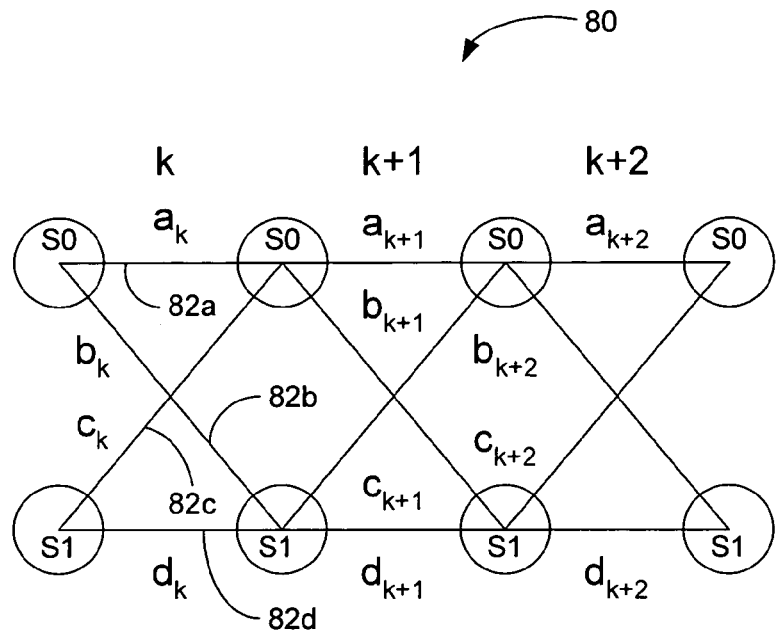
FIG. 5 is a conventional butterfly trellis.
Figure 13:
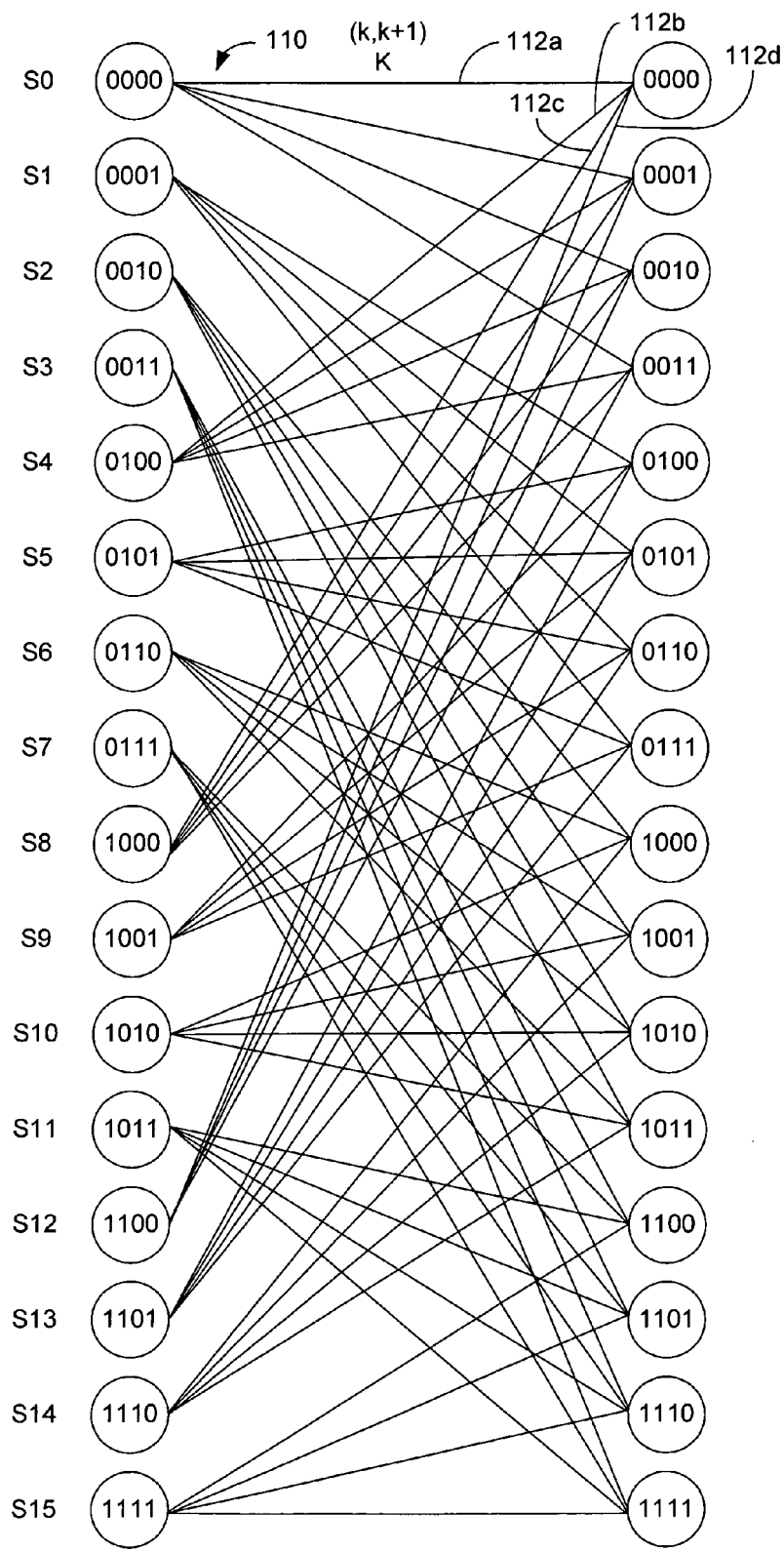
FIG. 13 is an unmodified trellis diagram for a half-rate $E^2PR4$ Viterbi detector.

FIG. 13 is a trellis diagram 110 for a two-sample-at-a-time, i.e., half-rate, E²PR4 Viterbi detector (FIG. 22) that can recover a sequence of binary values from a data signal. For a given data-recovery rate, the half-rate E²PR4 Viterbi detector can run at half the speed (i.e., the frequency of the sample clock can be cut in half) of the full-rate E²PR4 Viterbi detector (FIG. 2) because the half-rate detector processes two samples of the data signal at a time. Consequently, for a given sample-clock frequency, the half-rate E²PR4 Viterbi detector can recover binary values from the data signal at twice the rate of the full-rate E²PR4 Viterbi detector. Therefore, although the circuitry of the half-rate E²PR4 Viterbi detector is typically more complex than the circuitry of the full-rate E²PR4 Viterbi detector, the half-rate E²PR4 Viterbi detector is often preferred for high-speed applications such as reading data from a computer disk.

Figure 1A:
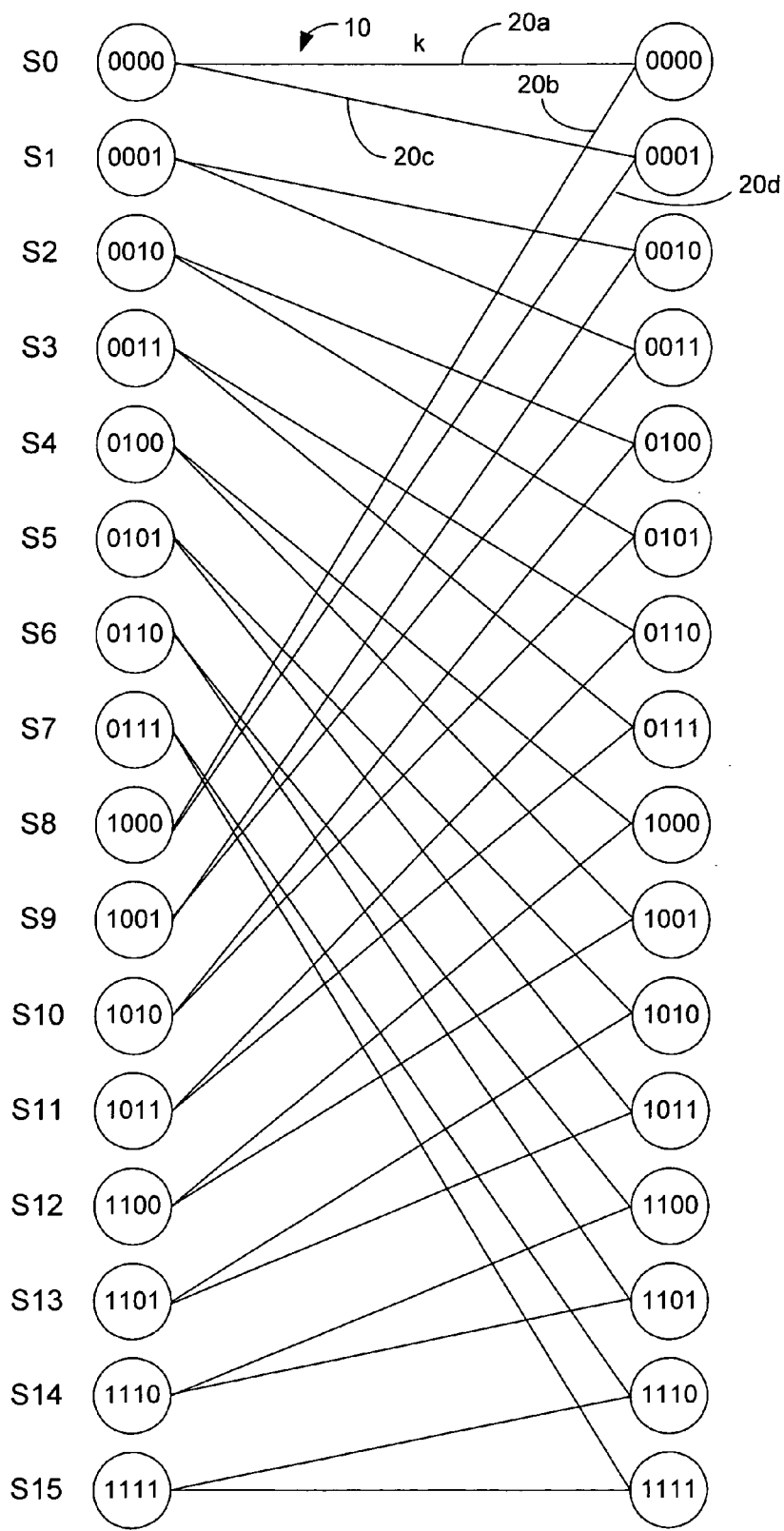
FIG. 1 is a trellis diagram for a conventional full-rate $E^2PR4$ Viterbi detector.

Still referring to FIG. 13, one can derive the half-rate trellis 110 from the full-rate trellis 10 of FIG. 1 by generating branches 112 (e.g., 112a, 112b, 112c, and 112d) that traverse two sample times k of the trellis 10. That is, each branch 112 represents two sequential branches 20 of the trellis 10. Therefore, the half-rate sample time K represents two consecutive samples Y, and thus is equivalent to two full-rate sample times k and k+1 which are shown in parentheses.

Furthermore, one can also derive the half-rate L2 branch metrics for each of the branches 112 by summing the full-rate L2 branch metrics (Table I) for the two respective branches 20 (FIG. 1) that compose each branch 112. Table II includes the pairs of ideal sample values Yf and Ys and the half-rate L2 branch metrics as a function of Yf and Ys for each of the branches 112, where Yf and Ys respectively represent the values of the first and second consecutive samples of the data signal that the half-rate E²PR4 Viterbi detector processes during each sample time K.

TABLE II

| Branch 112 | Ideal Sample Values Yf And Ys | Expression (L2 Metric) |
|---|---|---|
| S0 to S0 | 0, 0 | 0 |
| S0 to S1 | 0, +1 | 1 − 2Ys |
| S0 to S2 | +1, +2 | 5 − 2Yf − 4Ys |
| S0 to S3 | +1, +3 | 10 − 2Yf − 6Ys |
| S1 to S4 | +2, 0 | 4 − 4Yf |
| S1 to S5 | +2, +1 | 5 − 4Yf − 2Ys |
| S1 to S6 | +3, +2 | 13 − 6Yf − 4Ys |
| S1 to S7 | +3, +3 | 18 − 6Yf − 6Ys |
| S2 to S8 | 0, −2 | 4 + 4Ys |
| S2 to S9 | 0, −1 | 1 + 2Ys |
| S2 to S10 | +1, 0 | 1 − 2Yf |
| S2 to S11 | +1, +1 | 2 − 2Yf − 2Ys |
| S3 to S12 | +2, −2 | 8 − 4Yf + 4Ys |
| S3 to S13 | +2, −1 | 5 − 4Yf + 2Ys |
| S3 to S14 | +3, 0 | 9 − 6Yf |
| S3 to S15 | +3, +1 | 10 − 6Yf − 2Ys |
| S4 to S0 | −2, −1 | 5 + 4Yf + 2Ys |
| S4 to S1 | −2, 0 | 4 + 4Yf |
| S4 to S2 | −1, +1 | 2 + 2Yf − 2Ys |
| S4 to S3 | −1, +2 | 5 + 2Yf − 4Ys |
| S5 to S4 | 0, −1 | 1 + 2Ys |
| S5 to S5 | 0, 0 | 0 |
| S5 to S6 | +1, +1 | 2 − 2Yf − 2Ys |
| S5 to S7 | +1, +2 | 5 − 2Yf − 4Ys |
| S6 to S8 | −2, −3 | 13 + 4Yf + 6Ys |
| S6 to S9 | −2, −2 | 8 + 4Yf + 4Ys |
| S6 to S10 | −1, −1 | 2 + 2Yf + 2Ys |

TABLE II-continued

| Branch 112 | Ideal Sample Values Yf And Ys | Expression (L2 Metric) |
|---|---|---|
| S6 to S11 | −1, 0 | 1 + 2Yf |
| S7 to S12 | 0, −3 | 9 + 6Ys |
| S7 to S13 | 0, −2 | 4 + 4Ys |
| S7 to S14 | 1, −1 | 2 − 2Yf + 2Ys |
| S7 to S15 | 1, 0 | 1 − 2Yf |
| S8 to S0 | −1, 0 | 1 + 2Yf |
| S8 to S1 | −1, +1 | 2 + 2Yf − 2Ys |
| S8 to S2 | 0, +2 | 4 − 4Ys |
| S8 to S3 | 0, +3 | 9 − 6Ys |
| S9 to S4 | +1, 0 | 1 − 2Yf |
| S9 to S5 | +1, +1 | 2 − 2Yf − 2Ys |
| S9 to S6 | +2, +2 | 8 − 4Yf − 4Ys |
| S9 to S7 | +2, +3 | 13 − 4Yf − 6Ys |
| S10 to S8 | −1, −2 | 5 + 2Yf + 4Ys |
| S10 to S9 | −1, −1 | 2 + 2Yf + 2Ys |
| S10 to S10 | 0, 0 | 0 |
| S10 to S11 | 0, +1 | 1 − 2Ys |
| S11 to S12 | +1, −2 | 5 − 2Yf + 4Ys |
| S11 to S13 | +1, −1 | 2 − 2Yf + 2Ys |
| S11 to S14 | +2, 0 | 4 − 4Yf |
| S11 to S15 | +2, +1 | 5 − 4Yf − 2Ys |
| S12 to S0 | −3, −1 | 10 + 6Yf + 2Ys |
| S12 to S1 | −3, 0 | 9 + 6Yf |
| S12 to S2 | −2, 1 | 5 + 4Yf − 2Ys |
| S12 to S3 | −2, +2 | 8 + 4Yf − 4Ys |
| S13 to S4 | −1, −1 | 2 + 2Yf + 2Ys |
| S13 to S5 | −1, 0 | 1 + 2Yf |
| S13 to S6 | 0, +1 | 1 − 2Ys |
| S13 to S7 | 0, +2 | 4 − 4Ys |
| S14 to S8 | −3, −3 | 18 + 6Yf + 6Ys |
| S14 to S9 | −3, −2 | 13 + 6Yf + 4Ys |
| S14 to S10 | −2, −1 | 5 + 4Yf + 2Ys |
| S14 to S11 | −2, 0 | 4 + 4Yf |
| S15 to S12 | −1, −3 | 10 + 2Yf + 6Ys |
| S15 to S13 | −1, −2 | 5 + 2Yf + 4Ys |
| S15 to S14 | 0, −1 | 1 + 2Ys |
| S15 to S15 | 0, 0 | 0 |

Figure 14:
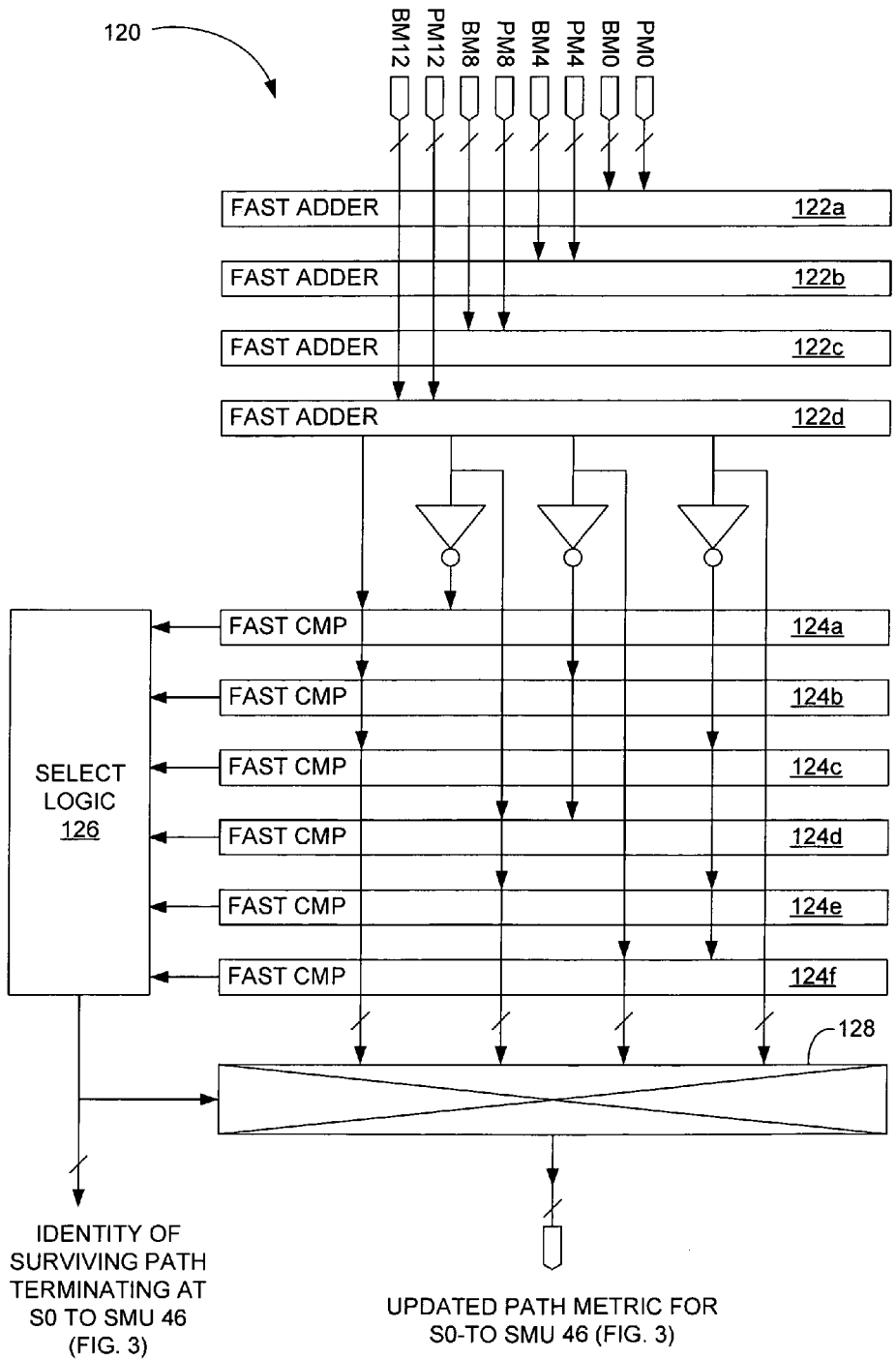
FIG. 14 is a block diagram of an ACS circuit that is part of an ACSU of a half-rate $E^2PR4$ Viterbi detector.

FIG. 14 is a block diagram of an ACS circuit 120, which forms a portion of an ACSU (not shown) for a half-rate E²PR4 Viterbi detector (not shown), where the circuit 120 determines the surviving path to the state S0 during each sample time K. Referring to FIG. 13, the branches 112a-112d that terminate at the state S0 after time K respectively originate from the states S0, S4, S8, and S12 prior to time K. Respectively associated with these branches are cumulative path metrics PM0, PM4, PM8, and PM12, and branch metrics BM0, BM4, BM8, and BM12. The circuit 120 includes four fast adders 122a-122d, six fast comparators 124a-124f, select logic 126, and a multiplexer 128. The adders 122a-122d respectively add the branch metrics BM0, BM4, BM8, and BM12 to the path metrics PM0, PM4, PM8, and PM12 to generate the following updated path metrics:

$$UPM0 = BM0 + PM0 \quad \quad 10)$$

$$UPM4 = BM4 + PM4 \quad \quad 11)$$

$$UPM8 = BM8 + PM8 \quad \quad 12)$$

$$UPM12 = BM12 + PM12 \quad \quad 13)$$

The comparators 124a-124f respectively determine the following differences:

$$UPM12 - UPM8 \quad \quad 14)$$

$$UPM12 - UPM4 \quad \quad 15)$$

$$UPM12 - UPM0 \quad \quad 16)$$

$$UPM8 - UPM4 \quad \quad 17)$$

UPM8−UPM0     18)

UPM4−UPM0     19)

Figure 22:
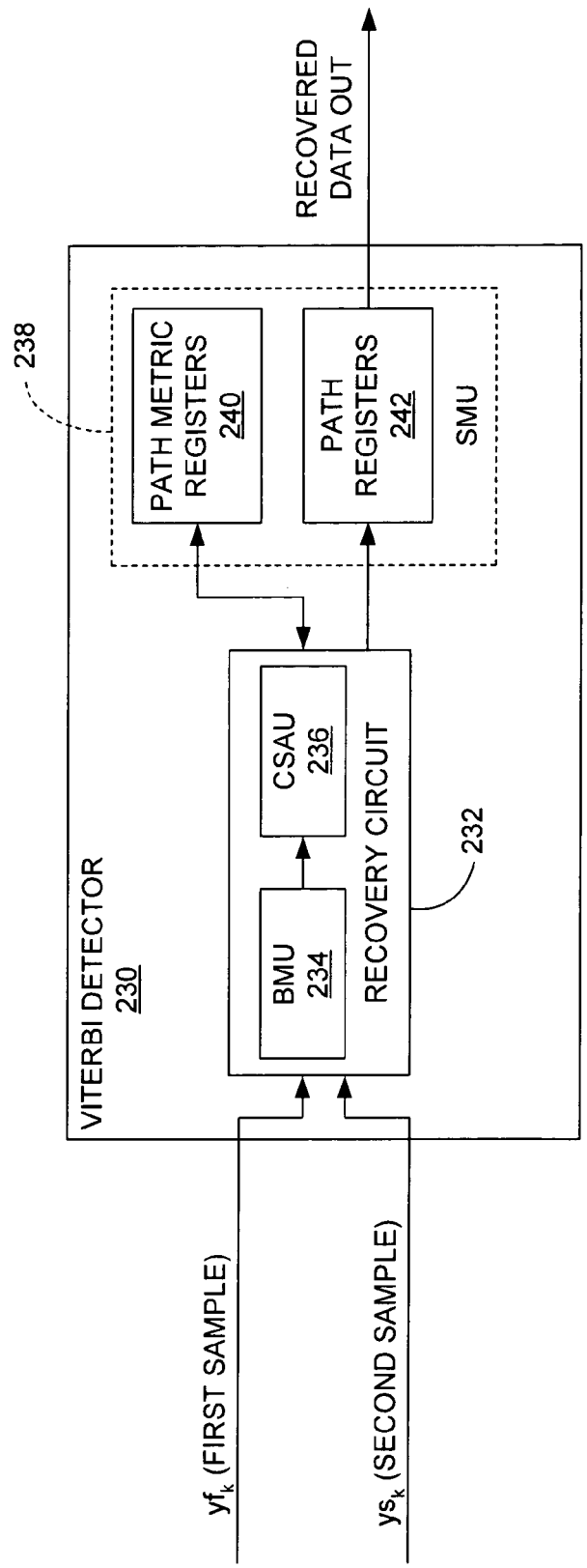
FIG. 22 is a block diagram of a half-rate $E^2PR4$ Viterbi detector that can incorporate the CSA circuits of FIGS. 20 and 21 according to an embodiment of the invention.

From these differences, the logic 126 determines which of the updated path metrics is the smallest, and causes the multiplexer 128 to load this smallest updated path metric into an SMU (FIG. 22). The logic 126 also identifies the surviving path (the path having the smallest updated path metric) to the SMU. The other circuits (not shown) of the ACSU that execute the ACS algorithm for the states S1-S15 are similar to and operate in parallel with the circuit 120.

Unfortunately, the circuit 120 includes a relatively large number of transistors so that the ACSU to which it belongs does not limit the data-recovery rate of the Viterbi detector more than is necessary. Specifically, the adders 122a-122d and comparators 124a-124f are designed to be as fast as possible so that the sample rate, and thus the Viterbi detector's recovery rate, can be as fast as possible. Unfortunately, designing the adders 122a-122d and the comparators 124a-124f to be fast typically entails using a relatively large number of logic gates, and thus a large number of transistors. This causes the circuit 120 to occupy a relatively large area of the integrated circuit on which it resides.

Figure 6:
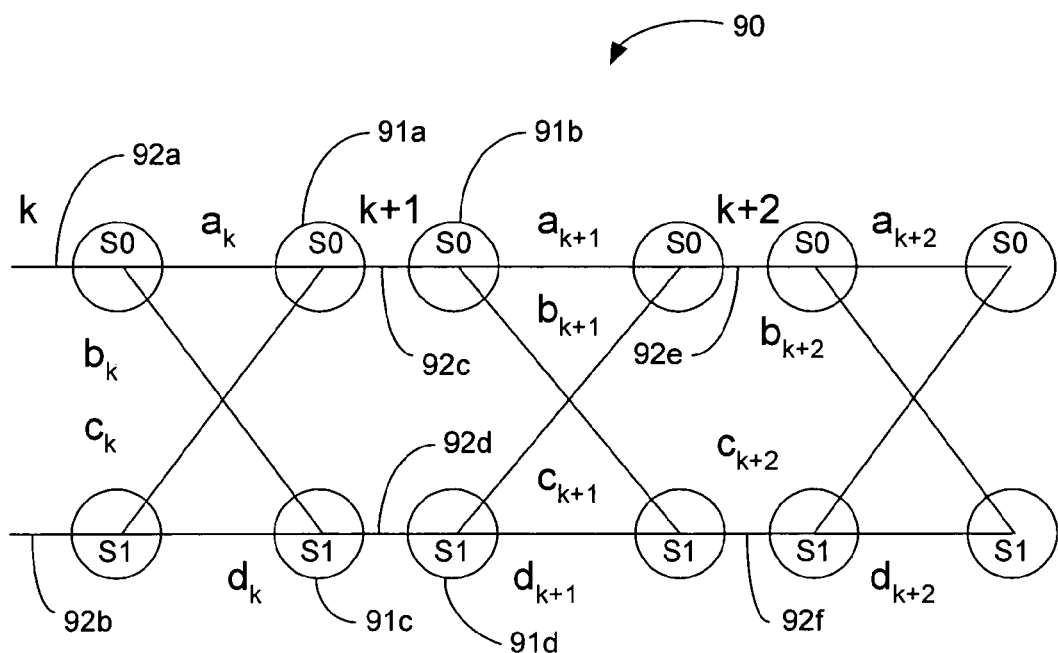
FIG. 6 is a conventional modified butterfly trellis having split state nodes and a modified timing alignment.
Figure 7:
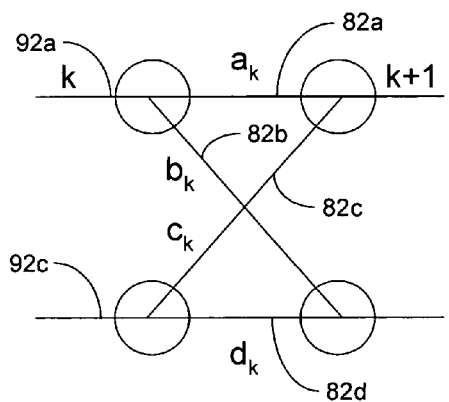
FIGS. 7-9 illustrate the application of a conventional branch-shifting technique to the modified butterfly trellis of FIG. 6.
Figure 8:
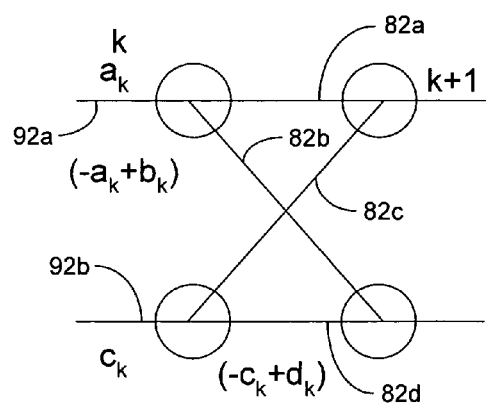
Figure 9:
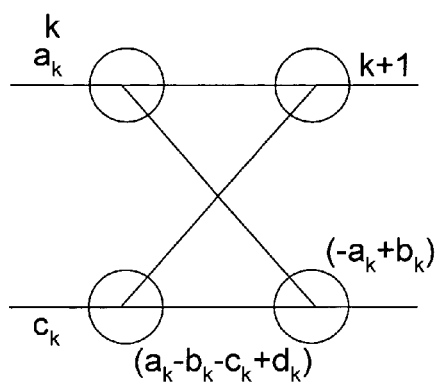
Figure 10:
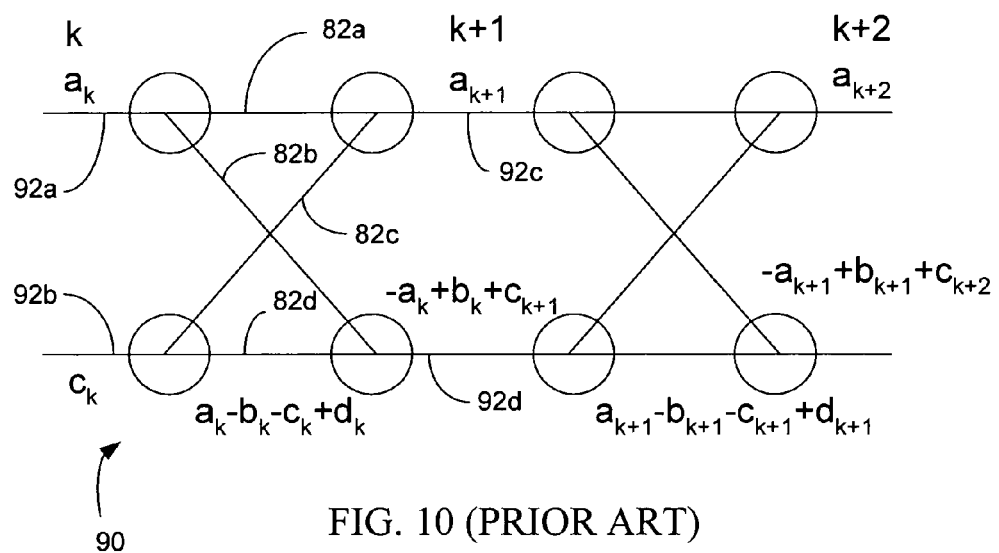
FIG. 10 is a diagram of the modified butterfly trellis of FIG. 6 after the application of the branch-shifting technique shown in FIGS. 7-9.
Figure 15:
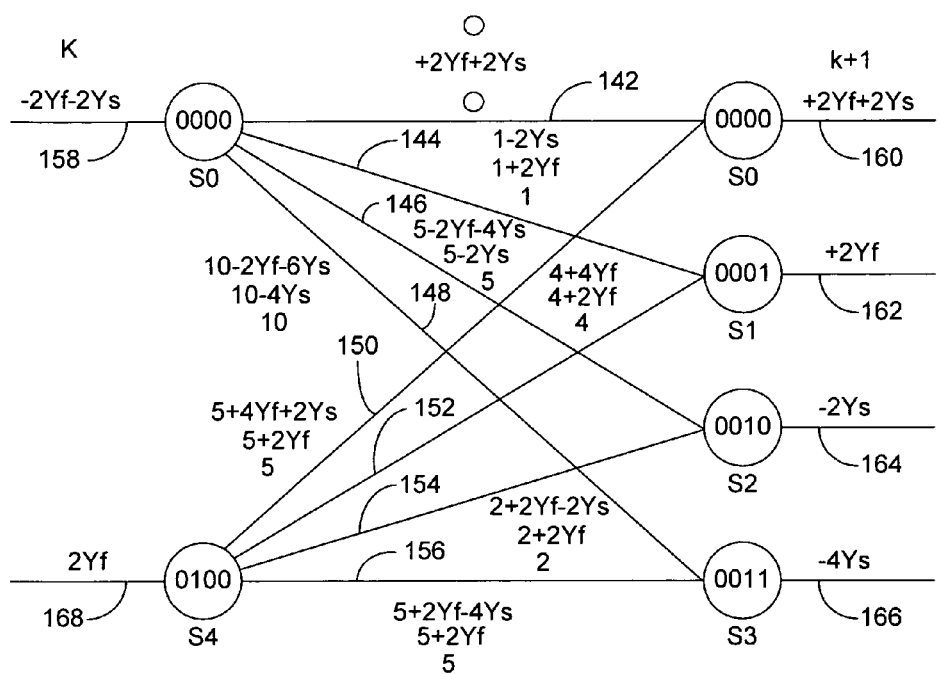
FIG. 15 illustrates application of a branch-shifting technique according to an embodiment of the invention to a portion of the trellis of FIG. 13.

FIG. 15 illustrates the application of a branch-shifting technique to a portion 140 of the half-rate trellis diagram 110 of FIG. 13 according to an embodiment of the invention. The portion 140 includes the states S0, S1, S2, S3, and S4, which are split into two nodes (only one node shown in FIG. 15) as discussed above in conjunction with FIG. 6. Although inner branches extend from the states S8 and S12 after time k to the states S0, S1, S2, S3 before time k+1, states S8 and S12 and these branches are omitted from FIG. 15 for clarity. But their omission does not alter the application of the branch-shifting technique described below.

Still referring to FIG. 15, the branch splitting is discussed in five steps, and the modified branch metrics resulting from each step appear adjacent to the corresponding branches. In the first step, one identifies the half-rate L2 branch metrics for each inner branch from Table II as follows:

Branch 142: 0     20)

Branch 144: 1−2Ys     21)

Branch 146: 5−2Yf−4Ys     22)

Branch 148: 10−2Yf−6Ys     23)

Branch 150: 5+4Yf+2Ys     24)

Branch 152: 4+4Yf     25)

Branch 154: 2+2Yf−2Ys     26)

Branch 156: 5+2Yf−4Ys     27)

In the second step, one adds −2Yf−2Ys to the branch metric (here 0) of the outer branch 158, and thus subtracts this value from the branch metrics of the inner branches 142, 144, 146, and 148 to obtain the following intermediate branch metrics for these inner branches:

Branch 142: 2Yf+2Ys     28)

Branch 144: 1+2Yf     29)

Branch 146: 5−2Ys     30)

Branch 148: 10−4Ys     31)

In the third step, one adds 2Yf+2Ys, 2Yf, −2Ys, and −4Ys, respectively, to the branch metrics of the outer branches 160, 162, 164, and 166 such that the modified branch metrics for the inner branches 142, 144, 146, and 148 are constants. The modified branch metrics for these branches are:

Branch 142: 0     32)

Branch 144: 1     33)

Branch 146: 5     34)

Branch 148: 10     35)

Branch 160: 2Yf+2Ys     36)

Branch 162: 2Yf     37)

Branch 164: −2Ys     38)

Branch 166: −4Ys     39)

In the fourth step, because 2Yf+2Ys, 2Yf, −2Ys, and −4Ys were respectively added to the branch metrics of the external branches 160, 162, 164, and 166, one subtracts these values from the branch metrics of the inner branches 150, 152, 154, and 156 to give:

Branch 150: 5+2Yf     40)

Branch 152: 4+2Yf     41)

Branch 154: 2+2Yf     42)

Branch 156: 5+2Yf     43)

In the fifth and final step, one adds 2Yf to the branch metric of the external branch 168 such that the modified branch metrics for the inner branches 150, 152, 154, and 156 are constants. Therefore, the modified branch metrics for these branches are:

Branch 150: 5     44)

Branch 152: 4     45)

Branch 154: 2     46)

Branch 156: 5     47)

Branch 168: 2Yf     48)

Consequently, the modified branch metrics for all the branches in the trellis portion 140 are:

Branch 142: 0     49)

Branch 144: 1     50)

Branch 146: 5     51)

Branch 148: 10     52)

Branch 150: 5     53)

Branch 152: 4     54)

Branch 154: 2     55)

Branch 156: 5     56)

Branch 158: −2Yf−2Ys     57)

Branch 160: 2Yf+2Ys     58)

Branch 162: 2Yf (59)

Branch 164: −2Ys (60)

Branch 166: −4Ys (61)

Branch 168: 2Yf (62)

As discussed above in conjunction with FIGS. 3-10 and below in conjunction with FIGS. 20-22, because the modified branch metrics for all of the inner branches 142, 144, 146, 148, 150, 152, 154, and 156 are constants, i.e., constant branch metrics or constant modified branch metrics, one can design a CSAU for the half-rate $E^2PR4$ Viterbi detector where the CSAU is smaller and/or faster than an ACSU (see FIG. 14). Also, although not shown, the above-described shifting of branch metrics results in the modified branch metrics equaling constants for the inner branches between the states S8 and S12 and S0, S1, S2, S3 as discussed below in conjunction with FIG. 16 and Table III.

TABLE III

| Inner Branch | (Constant) Modified Branch Metric |
|---|---|
| S0 to S0 | 0 |
| S0 to S1 | 1 |
| S0 to S2 | 5 |
| S0 to S3 | 10 |
| S1 to S4 | 4 |
| S1 to S5 | 5 |
| S1 to S6 | 8 |
| S1 to S7 | 13 |
| S2 to S8 | 4 |
| S2 to S9 | 1 |
| S2 to S10 | 1 |
| S2 to S11 | 2 |
| S3 to S12 | 8 |
| S3 to S13 | 5 |
| S3 to S14 | 9 |
| S3 to S15 | 10 |
| S4 to S0 | 5 |
| S4 to S1 | 4 |
| S4 to S2 | 2 |
| S4 to S3 | 5 |
| S5 to S4 | 1 |
| S5 to S5 | 0 |
| S5 to S6 | 2 |
| S5 to S7 | 5 |
| S6 to S8 | 13 |
| S6 to S9 | 8 |
| S6 to S10 | 2 |
| S6 to S11 | 1 |
| S7 to S12 | 9 |
| S7 to S13 | 4 |
| S7 to S14 | 2 |
| S7 to S15 | 1 |
| S8 to S0 | 1 |
| S8 to S1 | 2 |
| S8 to S2 | 4 |
| S8 to S3 | 9 |
| S9 to S4 | 1 |
| S9 to S5 | 2 |
| S9 to S6 | 8 |
| S9 to S7 | 13 |
| S10 to S8 | 5 |
| S10 to S9 | 2 |
| S10 to S10 | 0 |
| S10 to S11 | 1 |
| S11 to S12 | 5 |
| S11 to S13 | 2 |
| S11 to S14 | 4 |
| S11 to S15 | 5 |
| S12 to S0 | 10 |
| S12 to S1 | 9 |
| S12 to S2 | 5 |
| S12 to S3 | 8 |

TABLE III-continued

| Inner Branch | (Constant) Modified Branch Metric |
|---|---|
| S13 to S4 | 2 |
| S13 to S5 | 1 |
| S13 to S6 | 1 |
| S13 to S7 | 4 |
| S14 to S8 | 18 |
| S14 to S9 | 13 |
| S14 to S10 | 5 |
| S14 to S11 | 4 |
| S15 to S12 | 10 |
| S15 to S13 | 5 |
| S15 to S14 | 1 |
| S15 to S15 | 0 |

Figure 16:
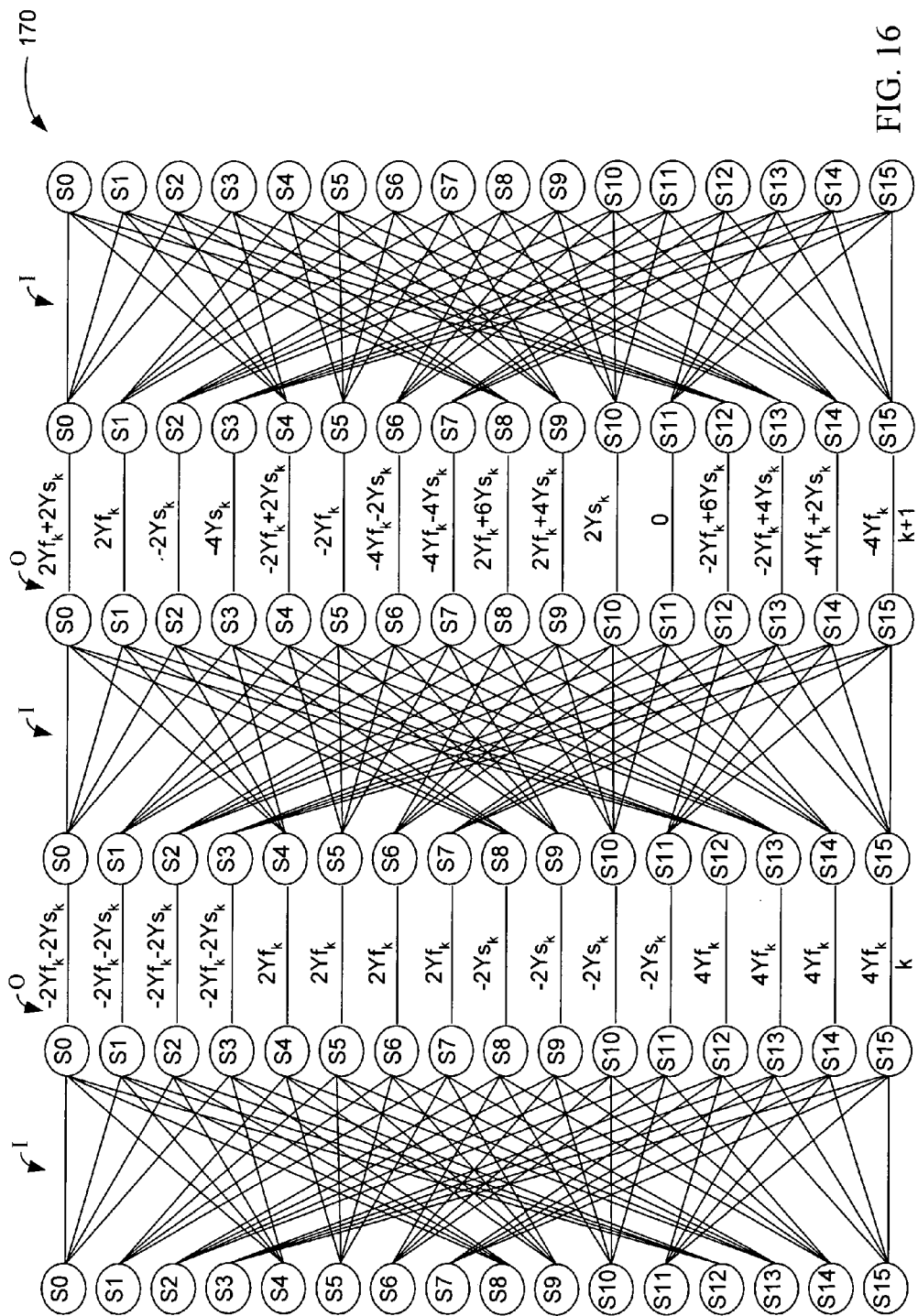
FIG. 16 illustrates application of the branch-shifting technique of FIG. 15 to the entire trellis of FIG. 13 according to an embodiment of the invention.

FIG. 16 is a split-state half-rate $E^2PR4$ trellis diagram 170 that labels all of the outer branches O with their respective non-time-shifted modified branch metrics, which one calculates according to the branch-shifting technique discussed above in conjunction with FIG. 15. Similarly, Table III includes the resulting constant modified branch metrics for all of the inner branches I.

Figure 17:
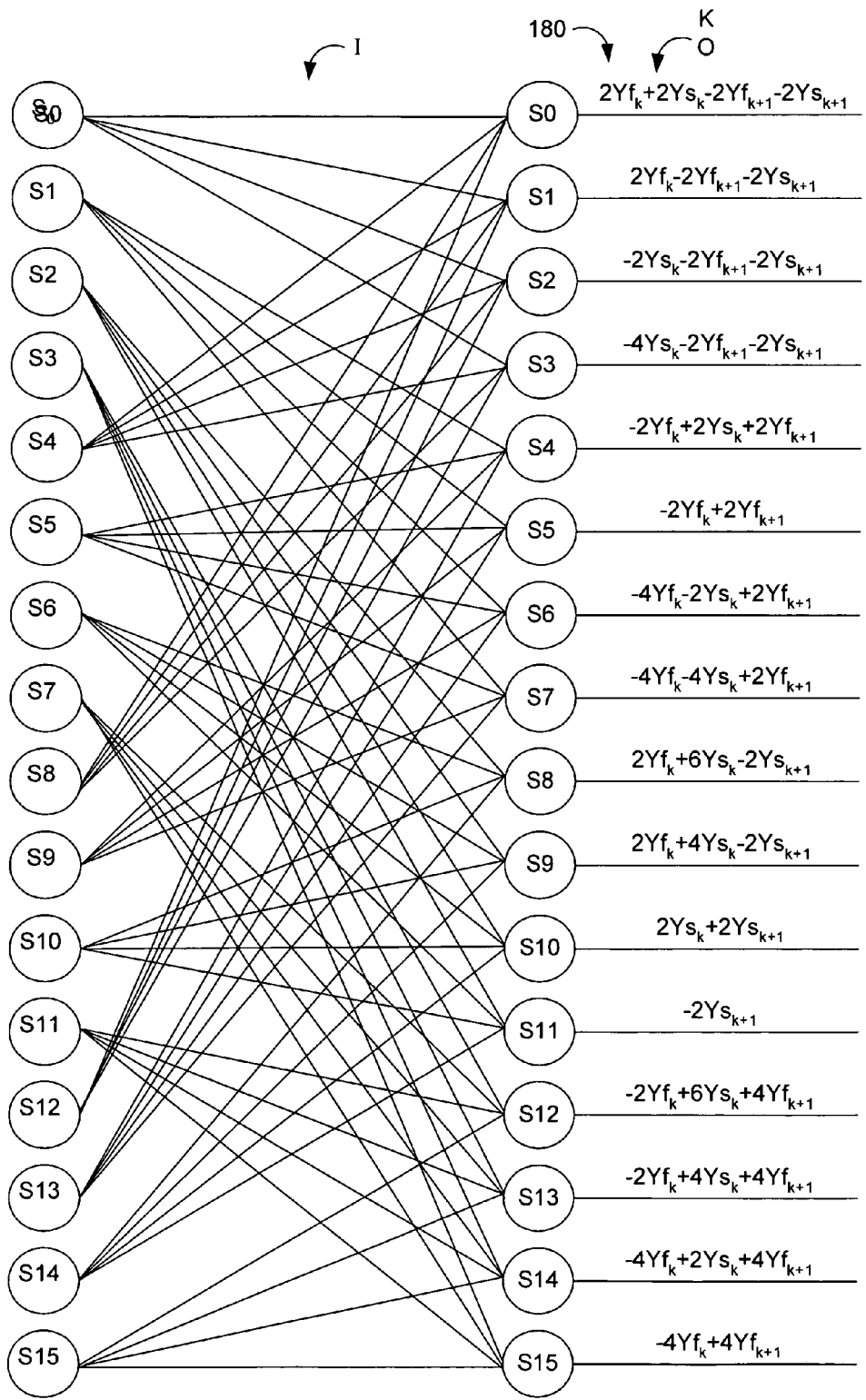
FIG. 17 is a modified half-rate $E^2PR4$ trellis diagram having shifted branch metrics according to an embodiment of the invention.

FIG. 17 is a branch-shifted half-rate $E^2PR4$ trellis diagram 180 that labels all of the outer branches O with their respective time-aligned modified branch metrics according to an embodiment of the invention. Referring to FIG. 15, although the outer branches 158 and 160 are viewed as separate branches for purposes of calculating the modified branch metrics, they are the same outer branch. That is, although not shown, the branch 160 extends to the state S0 that follows the sample time K+1. Therefore, the modified branch metrics for the branches 158 and 160 must be combined, and their samples Yf and Ys, which are time dependent, be labeled properly. The time-aligned modified branch metrics for the outer branches O are the results of this combining and labeling. The constant modified branch metrics for the inner branches I are unchanged by this combining and labeling, and thus retain the values listed in Table III.

Figure 18:
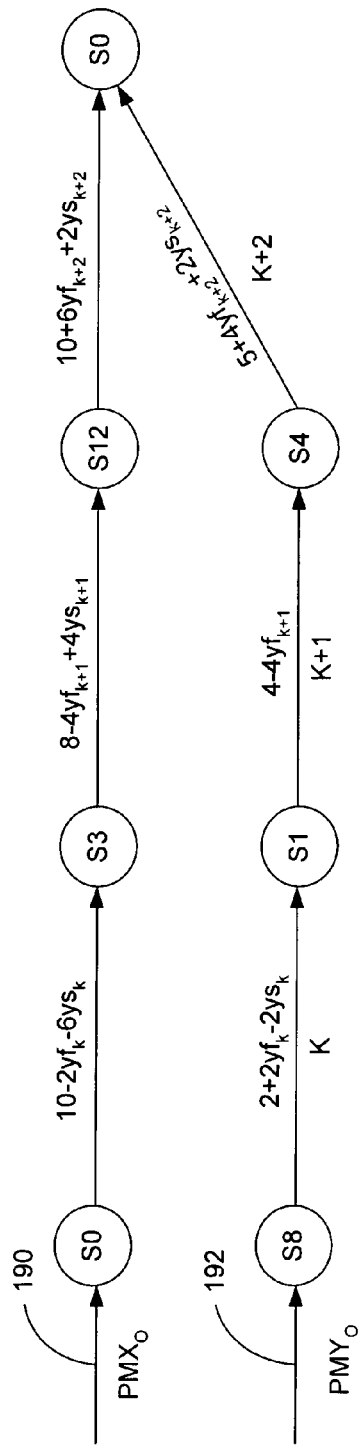
FIG. 18 illustrates two paths through the unmodified half-rate $E^2PR4$ trellis of FIG. 13 according to an embodiment of the invention.
Figure 19:
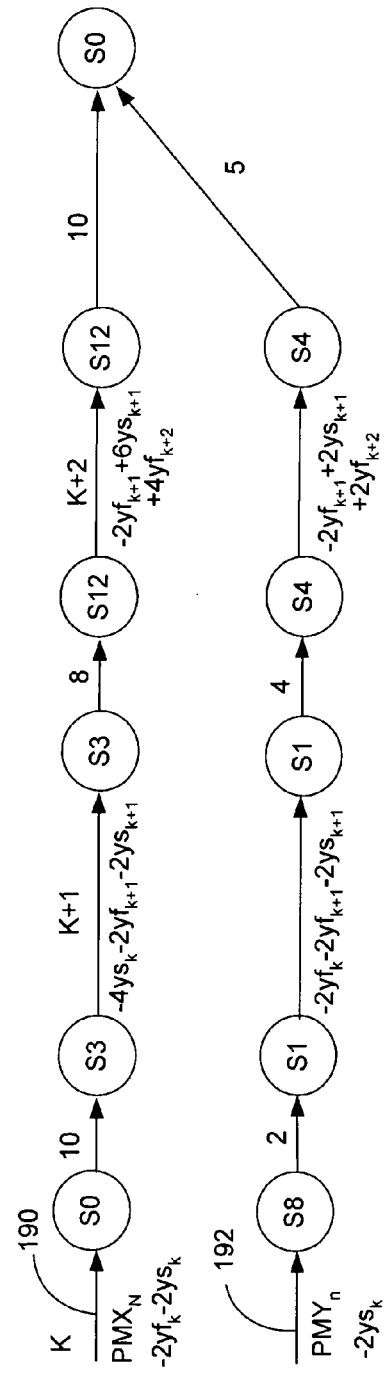
FIG. 19 illustrates the two paths through the branch-shifted half-rate $E^2PR4$ trellis of FIG. 17 according to an embodiment of the invention.

Referring to FIGS. 18 and 19, the branch-shifted half-rate trellis 180 of FIG. 17 is equivalent to the half-rate trellis 110 of FIG. 13. Specifically, the path metrics $PMX_n$ and $PMX_n$ of respective converging paths 190 and 192 through the branch-shifted trellis 180 have the same relationship to one another as do the path metrics $PMX_o$ and $PMY_o$ of the same paths 190 and 192 through the trellis 110. That is, if $PMX_o > PMY_o$, then $PMX_n > PMY_n$, and if $PMX_o < PMY_o$, then $PMX_n < PMY_n$.

But as discussed above in conjunction with FIGS. 11 and 12, as long as this relationship is retained, $PMX_n$ need not equal $PMX_o$, and $PMX_n$ need not equal $PMY_o$. The branches of the trellises 110 and 180 that do not lie along the paths 190 and 192 are omitted for clarity.

Referring to FIG. 18, using the L2 branch metrics of Table II and assuming that the path metrics $PMX_o$ and $PMY_o$ for the paths 190 and 192 have values of zero prior to sample time K, $PMX_o$ and $PMY_o$ at the convergence state S0 (after sample time K+2) are given by the following equations:

$$PMX_o = 10 - 2Yf_K - 6Ys_K + 8 - 4Yf_{K+1} + 4Ys_{K+1} + 10 + 6Yf_{K+2} + 2Ys_{K+2} \quad (63)$$

$$PMY_o = 2 + 2Yf_K - 2Ys_K + 4 - 4Yf_{K+1} + 5 + 4Yf_{K+2} + 2Ys_{K+2} \quad (64)$$

Similarly, referring to FIG. 19, using the modified branch metrics of FIG. 17 and Table III and assuming the that path metrics $PMX_n$ and $PMX_n$ for the paths 190 and 192 have values of zero prior to sample time K, $PMX_n$ and $PMX_n$ after sample time K+2 are given by the following equations:

$$PMX_n = -2Yf_K - 2Ys_K + 10 - 4Ys_K - 2Yf_{K+1} - 2Ys_{K+1} + 8 - 2Yf_{K+1} + 6Ys_{K+1} + 4Yf_{K+2} + 10 \quad (65)$$

$$PMY_n n = -2Ys_K + 2 + 2Yf_K - 2Yf_{K+1} - 2Ys_{K+1} + 4 - 2Yf_{K+1} + 2Ys_{K+1} + 2Yf_{K+2} + 5 \quad (66)$$

As discussed above in conjunction with FIGS. 11 and 12, it is well known that if A>B, then A+C>B+C. Therefore, if both $PMX_n$ and $PMY_n$ respectively differ from $PMX_o$ and $PMY_o$ by the same value C, then the relationship between $PMX_o^o$ and $PMX_n$ is the same as the relationship between $PMX_n^o$ and $PMY_o$. That is, if $PMX_o > PMY_o$, then $(PMX_o + C = PMX_n) > (PMY_o + C = PMY_n)$. Likewise, if $PMX_o < PMY_o$, then $(PMX_o + C = PMX_n) < (PMY_o + C = PMY_n)$. Here, referring to equations (63), (64), (65), and (66), $C = -2Yf_{k+2} - 2Ys_{k+2}$. Consequently, the branch-shifted trellis 180 preserves the relationships between the path metrics with respect to the trellis 110, and is thus mathematically equivalent to the trellis 110.

Figure 20:
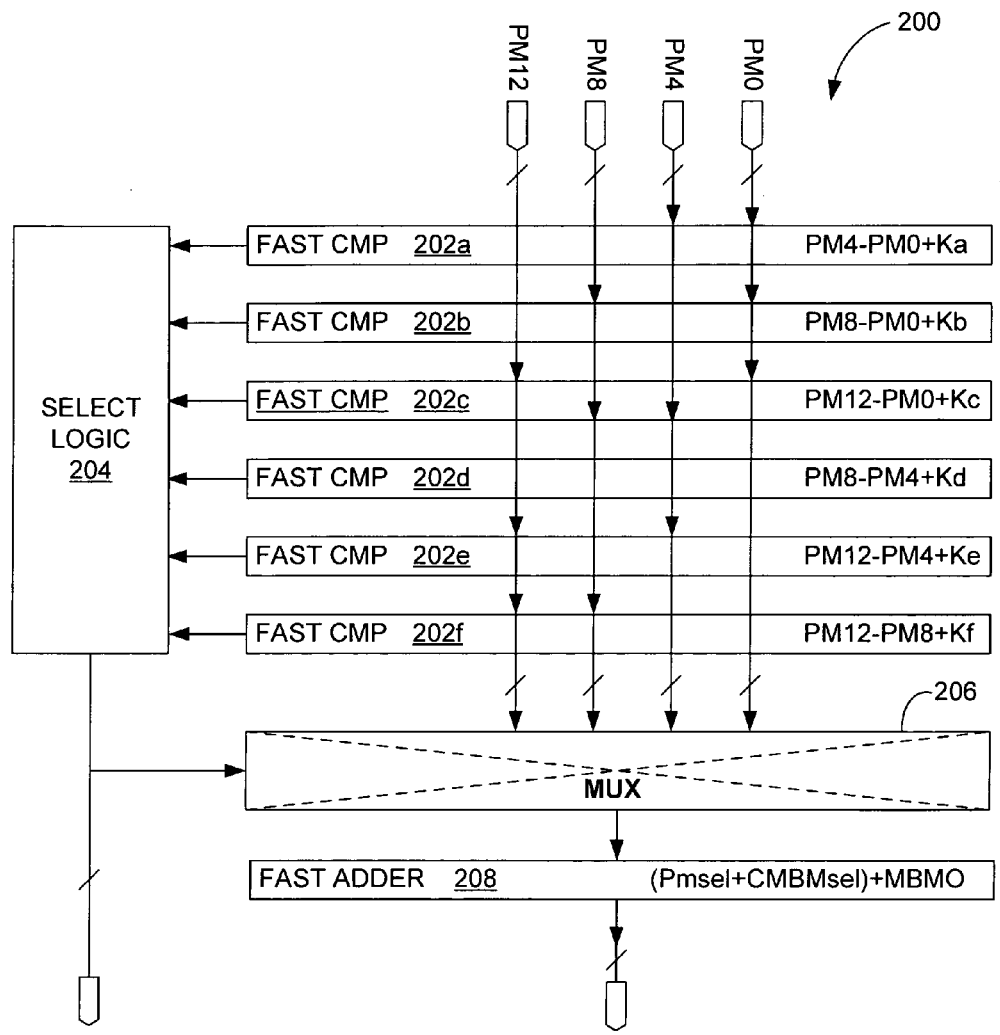
FIG. 20 is a block diagram of a CSA circuit that is part of a CSAU of a half-rate $E^2PR4$ Viterbi detector according to an embodiment of the invention.

Referring to FIG. 20, the branch-shifting technique described above in conjunction with FIGS. 15-19 allows one to convert the ACSU of a half-rate $E^2PR4$ Viterbi detector into a CSAU having fewer transistors. For example, an $E^2PR4$ Viterbi detector 230 (FIG. 22) can include such a CSAU.

FIG. 20 is a block diagram of a circuit 200 of such a CSAU, where the circuit 200 determines the surviving path to the state S0 and the corresponding surviving-path metric after each sample time K. Referring to FIG. 17, the inner branches that terminate at the state S0 prior to time K originate from the states S0, S4, S8, and S12. Respectively associated with these branches are path metrics PM0, PM4, PM8, and PM12, and the constant modified branch metrics CMBM0_0=0, CMBM4_0=5, CMBM8_0=1, and CMBM12_0=10 from Table III. The circuit 200 includes six fast comparators 202a-202f, select logic 204, a multiplexer 206, and a fast adder 208 for generating the surviving updated path metric UPM0 for the state S0. The comparators 202a-202f respectively determine the following differences between modified path metrics, where a modified path metric is the sum of the path metric PM and the corresponding constant modified branch metric CMBM:

$$(PM4+CMBM4\_0)-(PM0+CMBM0\_0) \quad (67)$$

$$(PM8+CMBM8\_0)-(PM0+CMBM0\_0) \quad (68)$$

$$(PM12+CMBM12\_0)-(PM0+CMBM0\_0) \quad (69)$$

$$(PM8+CMBM8\_0)-(PM4+CMBM4\_0) \quad (70)$$

$$(PM12+CMBM12\_0)-(PM4+CMBM4\_0) \quad (71)$$

$$(PM12+CMBM12\_0)-(PM8+CMBM8\_0) \quad (72)$$

The terms of these differences can be rearranged as:

$$(PM4-PM0)+(CMBM4\_0-CMBM0\_0) \quad (73)$$

$$(PM8-PM0)+(CMBM8\_0-CMBM0\_0) \quad (74)$$

$$(PM12-PM0)+(CMBM12\_0-CMBM0\_0) \quad (75)$$

$$(PM8-PM4)+(CMBM8\_0-CMBM4\_0) \quad (76)$$

$$(PM12-PM4)+(CMBM12\_0-CMBM4\_0) \quad (77)$$

$$(PM12-PM8)+(CMBM12\_0-CMBM8\_0) \quad (78)$$

Because CMBM0_0, CMBM4_0, CMBM8_0, and CMBM12_0 are constants, the comparators 202a-202f can be hardwired or programmed to respectively perform the following calculations:

$$PM4-PM0+Ka \quad (79)$$

$$PM8-PM0+Kb \quad (80)$$

$$PM12-PM0+Kc \quad (81)$$

$$PM8-PM4+Kd \quad (82)$$

$$PM12-PM4+Ke \quad (83)$$

$$PM12-PM8+Kf \quad (84)$$

where $$Ka=CMBM4\_0-CMBM0\_0=5 \quad (85)$$

$$Kb=CMBM8\_0-CMBM0\_0=1 \quad (86)$$

$$Kc=CMBM12\_0-CMBM0\_0=10 \quad (87)$$

$$Kd=CMBM8\_0-CMBM4\_0=-4 \quad (88)$$

$$Ke=CMBM12\_0-CMBM4\_0=5 \quad (89)$$

$$Kf=CMBM12\_0-CMBM8\_0=9 \quad (90)$$

From the differences (85)-(90), the logic 204 selects via the multiplexer 206 the smallest modified path metric MPMsel=Min(PM12+CMBM12_0, PM8+CMBM8_0, PM4+CMBM4_0, PM0+CMBM0_0). The multiplexer 206 is hardwired to add the proper CMBMsel value to the MPMsel value. For example, if PM12+CMBM12_0 is the smallest modified path metric, then the multiplexer 206 is hardwired to generate the sum PM12+CMBM12_0. The adder 208 then sums (PMsel+CMBMsel) and the modified branch metric for state S0, $MBM0=2Yf_k+2Ys_k-2Yf_{k+1}-2Ys_{k+1}$ (FIG. 17), to generate the updated path metric, UPM0, for state S0 and loads UPM0 into the SMU 238 (FIG. 22). The logic 204 also identifies the surviving path to the SMU.

The other circuits (not shown) of the CSAU that execute the CSA algorithm for the states S1-S15 are similar to and operate in parallel with the circuit 200. Table IV includes the values of Ka-Kf for all of these other circuits.

TABLE IV

| State | Ka | Kb | Kc | Kd | Ke | Kf |
|-------|-----|-----|------|------|-----|------|
| S0 | +5 | +1 | +10 | −4 | +5 | +9 |
| S1 | +3 | +4 | +8 | −2 | +5 | +7 |
| S2 | −3 | −1 | 0 | +2 | +3 | +1 |
| S3 | −5 | −1 | −2 | +4 | +3 | −1 |
| S4 | −3 | −3 | −2 | −0 | +1 | +1 |
| S5 | −5 | −3 | −4 | +2 | +1 | −1 |
| S6 | −11 | −5 | −12 | +6 | −1 | −7 |
| S7 | −7 | −2 | −14 | +8 | −1 | −9 |
| S8 | +9 | +1 | −8 | +14 | +2 | +7 |
| S9 | +7 | +1 | −6 | +12 | +5 | +11 |
| S10 | +1 | −1 | −2 | +4 | +3 | +5 |
| S11 | −1 | −1 | 0 | +2 | +3 | +3 |
| S12 | +1 | −3 | −4 | +2 | +1 | +5 |
| S13 | −1 | −3 | −2 | 0 | +1 | +3 |
| S14 | −7 | −5 | +2 | −8 | −1 | −3 |
| S15 | −9 | −5 | +4 | −10 | −1 | −5 |

Implementing the CSA algorithm using the modified branch metrics of FIG. 17 and the constants of Table IV allows the circuit 200 to include fewer transistors than the circuit 120 (FIG. 14), which implements the ACS algorithm. Specifically, the circuit 200 (FIG. 20) has three fewer fast adders than the circuit 120. Consequently, a CSAU that includes sixteen circuits 200 (one for each state S0-S15) has forty eight fewer fast adders than an ACSU formed from multiple circuits 120. This provides a significant reduction in the number of logic gates and transistors, which reduces the layout area of the CSAU as compared to that of the ACSU.

Figure 21:
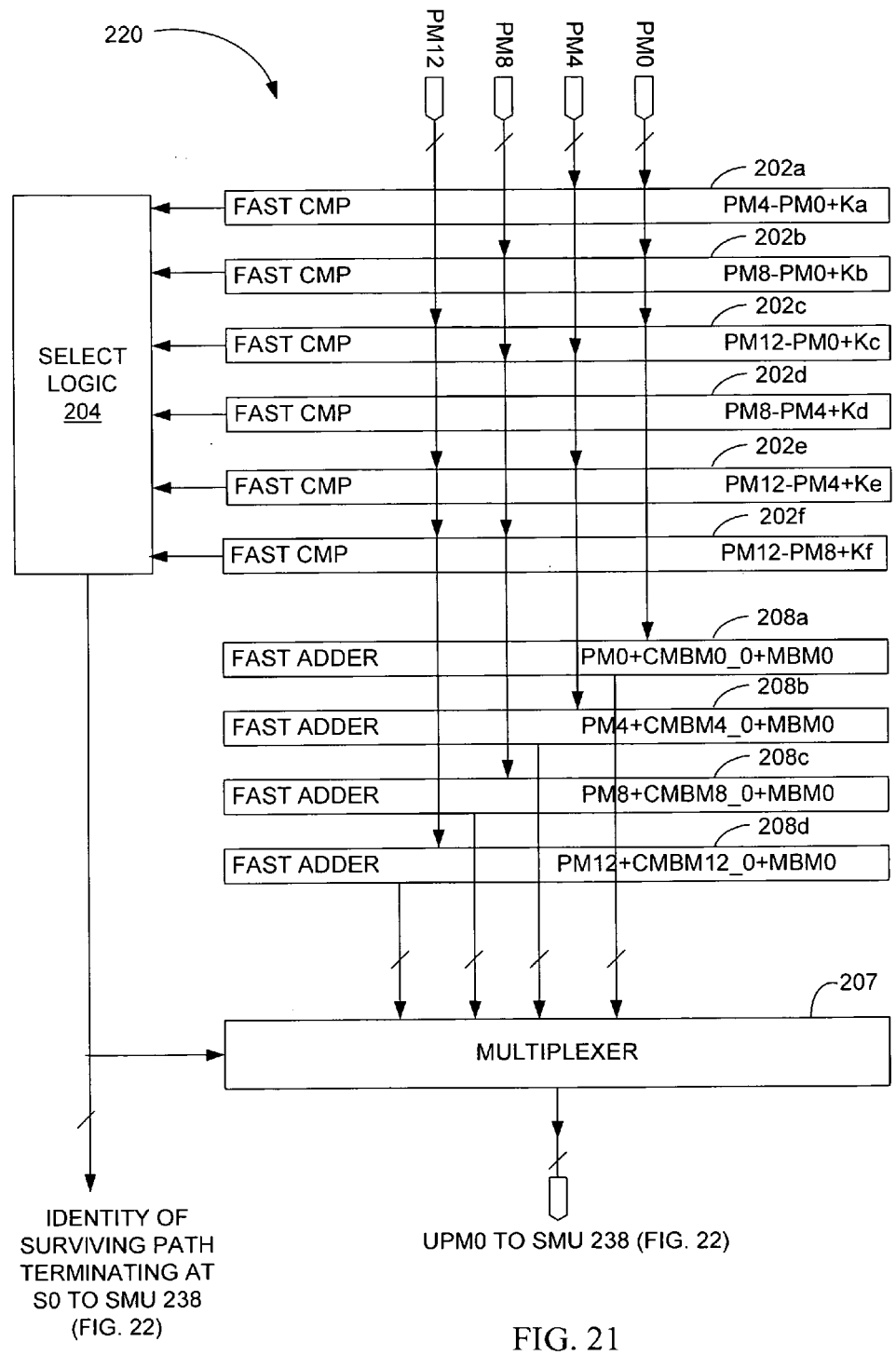
FIG. 21 is a block diagram of a CSA circuit that is part of a CSAU of a half-rate $E^2PR4$ Viterbi detector according to another embodiment of the invention.

FIG. 21 is a block diagram of a CSA circuit 220 according to another embodiment of the invention. Although the circuit 220 has the same number of fast adders and comparators as the circuit 120 of FIG. 14, it is faster than both the circuit 120 and the circuit 200 of FIG. 20 because it performs the additions and comparisons simultaneously.

Like the CSA circuit 200 of FIG. 20, the circuit 220 determines the surviving path to the state S0 and the corresponding surviving-path metric UPM0 immediately after each sample time K. The circuit 220 includes the six fast comparators 202a-202f, select logic 204, and multiplexer 206, but also includes four fast adders 208a-208f. The comparators 202a-202f respectively determine the differences (79)-(84) as discussed above in conjunction with FIG. 20. From these differences, the logic 204 selects via the multiplexer 106 the smallest modified path metric MPMsel=Min(PM12+CMBM12_0, PM8+CMBM8_0, PM4+CMBM4_0, PM0+CMPM0_0).

But while the comparators 202a-202f are determining the smallest modified path metric, the adders 208a-208d are respectively generating updated path metrics for the paths having the path metrics PM0, PM4, PM8, and PM12. Therefore, the circuit 220 can provide the updated path metric UPM0 sooner because unlike the circuit 200 (FIG. 20), it does not wait until after the comparison is finished before commencing the addition of the selected modified path metric and the modified branch metric. Specifically, the adders 208a-208f determine the following sums, which are the updated path metrics and where PM+CMBM are the modified path metrics:

$$PM0+CMBM0\_0+MBM0 \quad \quad 91)$$

$$PM4+CMBM4\_0+MBM0 \quad \quad 92)$$

$$PM8+CMBM8\_0+MBM0 \quad \quad 93)$$

$$PM12+CMBM12\_0+MBM0 \quad \quad 94)$$

where CMBM0_0, CMBM4_0, CMBM8_0, and CMBM12_0 are listed in Table III and MBM0 is shown in FIG. 17.

Once the select logic 204 identifies the smallest modified path metric out of PM0+CMBM0_0, PM4+CMBM4_0, PM8+CMBM8_0, and PM12+CMBM12_0, it causes the multiplexer 206 to select as the updated path metric UPM0 the output of the adder that updated the smallest modified path metric MPM, and to load UPM0 into the SMU (FIG. 22). The logic 204 also identifies the surviving path to the SMU.

Still referring to FIG. 21, the other circuits of the CSAU that execute the CSA algorithm for the states S1-S15 are similar to and operate in parallel with the circuit 220.

As stated above, because the comparators 202a-202f and the adders 208a-208d operate in parallel and not serially as in the circuit 200 of FIG. 20, the circuit 220 is faster than the circuits 120 and 220, and has no more transistors than the circuit 120 (FIG. 14).

FIG. 22 is a block diagram of a half-rate E²PR4 Viterbi detector 230, which includes a CSAU 236 that incorporates one or more of the circuits 200 (FIG. 20) or 220 (FIG. 21) according to an embodiment of the invention. If the CSAU 236 includes one or more circuits 200, then the detector 230 is typically smaller than an E²PR4 Viterbi detector that includes an ACSU because the circuit 200 is smaller and less complex than the circuit 120 (FIG. 14) as discussed above in conjunction with FIG. 20. Alternatively, if the CSAU 236 includes one or more circuits 220, then the detector 230 is typically faster than an E²PR4 detector that includes an ACSU or a CSAU that includes the circuits 200 because the circuit 220 is faster than the circuit 120 and the circuit 200 as discussed above in conjunction with FIG. 21.

The detector 230 includes a recovery circuit 232, which includes a BMU 234 and the CSAU 236, which includes one or more of the circuits 200 or 220—typically sixteen of either the circuits 200 or 220, one for each state S0-S15. The detector 230 also includes a SMU 238, which includes surviving-path-metric registers 240 and surviving-path registers 242, typically one register 240 and one register 242 for each state S0-S15.

In operation, the detector 230 receives a pair of consecutive samples $Yf_K$ and $Ys_K$, and the BMU 234 calculates the modified branch metrics (FIG. 17) for all of the states S0-S15 from the received samples. As stated above, these samples may be filtered by circuitry not shown in FIG. 22. The CSAU 236 compares the modified path metrics of the paths terminating at each state S to one another, and selects the smallest modified path metric UMPM for each state S. If the CSAU 236 includes the circuits 200, then, after the CSAU 236 is finished comparing and selecting, it adds the modified branch metric MBM for each state S to the corresponding selected modified path metric MPM to generate an updated path metric UPM for each state. Conversely, if the CSAU 236 includes the circuits 220, it generates updated path metrics UPM for each of the paths while it is comparing the modified path metrics MPM, and then selects the updated path metric UPM corresponding to the smallest modified path metric MPM. Next, the CSAU 236 loads the updated path metrics UPM into the respective registers 240, and causes the surviving paths to be loaded into the respective registers 242.

Figure 23:
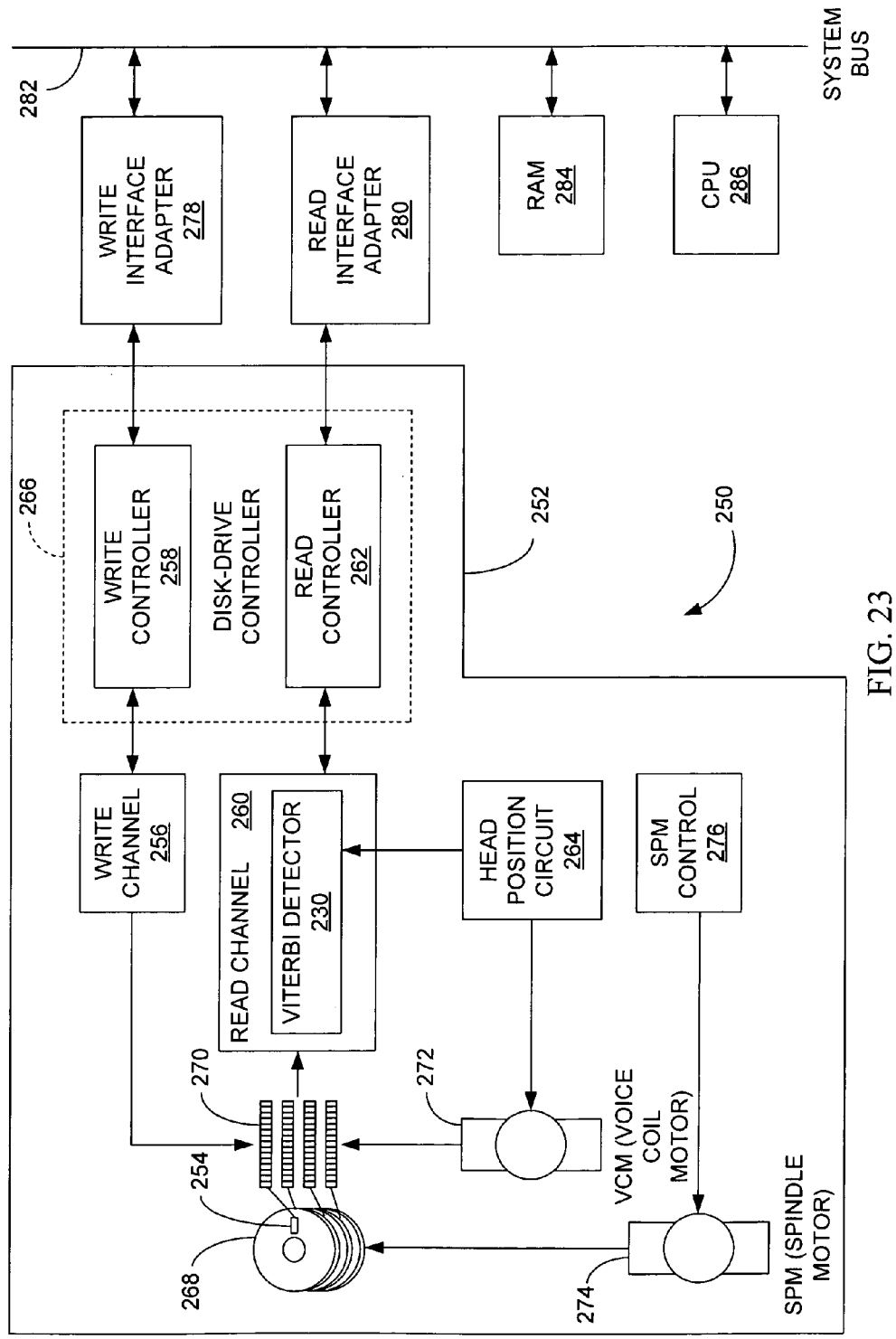
FIG. 23 is a block diagram of a disk-drive system that can incorporate the half-rate $E^2PR4$ Viterbi detector of FIG. 22 according to an embodiment of the invention.

FIG. 23 is a block diagram of a disk-drive system 250 that incorporates the half-rate E²PR4 Viterbi detector 230 of FIG. 22 according to an embodiment of the invention. The disk-drive system 250 includes a disk drive 252, which includes a read-write head 254, a write channel 256 for generating and driving the head 254 with a write signal, and a write controller 258 for interfacing the write data to the write channel 256. The disk drive 252 also includes a read channel 260, which receives servo and application-data read signals from the head 254, and which includes the Viterbi detector 230 for recovering data from the read signal, or both the read and servo signals, and includes a read controller 262 for interfacing the read data to an external bus (see below). The read channel 260 provides the recovered servo data to a head-position circuit 264. Together, the write and read controllers 258 and 262 compose a disk-drive controller 266. The disk drive 252 further includes a storage medium such as one or more disks 268, each of which may contain data on one or both sides and which may be magnetic, optical, or another type of storage disk. The head 254 writes/reads the data stored on the disks 268, and is connected to a movable support arm 270. The head-position circuit 264 provides a control signal to a voice-coil motor (VCM) 272, which positionally maintains/radially moves the arm 270 so as to positionally maintain/radially move the head 254 over the desired data tracks on the disks 268. A spindle motor (SPM) 274 and a SPM control circuit 276 respectively rotates the disks 268 and maintains them at the proper rotational speed.

The disk-drive system 250 also includes write and read interface adapters 278 and 280 for respectively interfacing the disk-drive controller 266 to a system bus 282, which is specific to the system used. Typical system busses include ISA, PCI, S-Bus, Nu-Bus, etc. The system 250 typically has other devices, such as a random access memory (RAM) 284 and a central processing unit (CPU) 286 coupled to the bus 282.

What is claimed is:

1. A Viterbi detector, comprising:
an input terminal operable to receive a sample of a signal that represents a sequence of values;
a recovery circuit coupled to the input terminal and operable to recover the sequence from the signal by,
adding only a respective predetermined first constant to each path metric for paths associated with the sequence to one of a plurality of $E^2PR4$ states associated with the sequence to generate respective modified path metrics for the paths;
identifying as a surviving path the one of the paths having the smallest modified path metric,
calculating a branch metric from the sample,
adding the branch metric to the smallest modified path metric after identifying the surviving path to generate an updated path metric, and
associating the updated path metric with the one of the $E^2PR4$ states;
wherein the recovery circuit is further operable to add a constant to each path metric by,
calculating the respective differences between each pair of path metrics for the paths to the one of the $E^2PR4$ states, and
adding a respective predetermined second constant to each of the differences to generate respective modified differences, the predetermined second constant being a combination of the predetermined first constants corresponding to the pair of path metrics for which the respective difference is calculated;
wherein the recovery circuit is further operable to identify the surviving path by determining from the modified differences which of the modified path metrics is the smallest modified path metric; and
wherein the respective predetermined second constants are selected from the following table:

| $E^2PR4$ States | Second Constants | | | | | |
|---|---|---|---|---|---|---|
| | Ka | Kb | Kc | Kd | Ke | Kf |
| S0 | +5 | +1 | +10 | −4 | +5 | +9 |
| S1 | +3 | +4 | +8 | −2 | +5 | +7 |
| S2 | −3 | −1 | 0 | +2 | +3 | +1 |
| S3 | −5 | −1 | −2 | +4 | +3 | −1 |
| S4 | −3 | −3 | −2 | −0 | +1 | +1 |
| S5 | −5 | −3 | −4 | +2 | +1 | −1 |
| S6 | −11 | −5 | −12 | +6 | −1 | −7 |
| S7 | −7 | −2 | −14 | +8 | −1 | −9 |
| S8 | +9 | +1 | −8 | +14 | +2 | +7 |
| S9 | +7 | +1 | −6 | +12 | +5 | +11 |
| S10 | +1 | −1 | −2 | +4 | +3 | +5 |
| S11 | −1 | −1 | 0 | +2 | +3 | +3 |
| S12 | +1 | −3 | −4 | +2 | +1 | +5 |
| S13 | −1 | −3 | −2 | 0 | +1 | +3 |
| S14 | −7 | −5 | +2 | −8 | −1 | −3 |
| S15 | −9 | −5 | +4 | −10 | −1 | −5. |

2. The Viterbi detector of claim 1 wherein:
the input terminal is operable to receive multiple samples of the signal; and
the recovery circuit is operable to calculate the branch metric from two consecutive samples.

3. A Viterbi detector, comprising:
an input terminal operable to receive samples of a signal that represents a sequence of values;
a surviving-path register; and
a recovery circuit coupled to the input terminal and to the register and operable to recover the sequence from the samples by,
calculating a respective difference between each pair of path metrics for paths associated with the sequence, the paths terminating at one of a plurality of $E^2PR4$ states associated with the sequence,
adding only a respective predetermined first constant to each of the differences to generate modified differences,
selecting a surviving path based on the modified differences,
calculating a branch metric from one or more of the samples,
adding the branch metric and a respective predetermined second constant to the path metric of the surviving path after selecting the surviving path to generate an updated path metric for the one of the $E^2PR4$ states,
loading the surviving path into the surviving-path register,
wherein the respective predetermined first constants are selected from the following table,

| $E^2PR4$ States | First Constants | | | | | |
|---|---|---|---|---|---|---|
| | Ka | Kb | Kc | Kd | Ke | Kf |
| S0 | +5 | +1 | +10 | −4 | +5 | +9 |
| S1 | +3 | +4 | +8 | −2 | +5 | +7 |
| S2 | −3 | −1 | 0 | +2 | +3 | +1 |
| S3 | −5 | −1 | −2 | +4 | +3 | −1 |
| S4 | −3 | −3 | −2 | −0 | +1 | +1 |
| S5 | −5 | −3 | −4 | +2 | +1 | −1 |
| S6 | −11 | −5 | −12 | +6 | −1 | −7 |
| S7 | −7 | −2 | −14 | +8 | −1 | −9 |
| S8 | +9 | +1 | −8 | +14 | +2 | +7 |
| S9 | +7 | +1 | −6 | +12 | +5 | +11 |
| S10 | +1 | −1 | −2 | +4 | +3 | +5 |
| S11 | −1 | −1 | 0 | +2 | +3 | +3 |
| S12 | +1 | −3 | −4 | +2 | +1 | +5 |
| S13 | −1 | −3 | −2 | 0 | +1 | +3 |
| S14 | −7 | −5 | +2 | −8 | −1 | −3 |
| S15 | −9 | −5 | +4 | −10 | −1 | −5 | and
wherein the respective predetermined second constant is selected from the following table:

| E²PR4 Paths | Second Constants |
|---|---|
| S0 to S0 | 0 |
| S0 to S1 | 1 |
| S0 to S2 | 5 |
| S0 to S3 | 10 |
| S1 to S4 | 4 |
| S1 to S5 | 5 |
| S1 to S6 | 8 |
| S1 to S7 | 13 |
| S2 to S8 | 4 |
| S2 to S9 | 1 |
| S2 to S10 | 1 |
| S2 to S11 | 2 |
| S3 to S12 | 8 |
| S3 to S13 | 5 |
| S3 to S14 | 9 |
| S3 to S15 | 10 |
| S4 to S0 | 5 |
| S4 to S1 | 4 |
| S4 to S2 | 2 |
| S4 to S3 | 5 |
| S5 to S4 | 1 |
| S5 to S5 | 0 |
| S5 to S6 | 2 |
| S5 to S7 | 5 |
| S6 to S8 | 13 |
| S6 to S9 | 8 |
| S6 to S10 | 2 |
| S6 to S11 | 1 |
| S7 to S12 | 9 |
| S7 to S13 | 4 |
| S7 to S14 | 2 |
| S7 to S15 | 1 |
| S8 to S0 | 1 |
| S8 to S1 | 2 |
| S8 to S2 | 4 |
| S8 to S3 | 9 |
| S9 to S4 | 1 |
| S9 to S5 | 2 |
| S9 to S6 | 8 |
| S9 to S7 | 13 |
| S10 to S8 | 5 |
| S10 to S9 | 2 |
| S10 to S10 | 0 |
| S10 to S11 | 1 |
| S11 to S12 | 5 |
| S11 to S13 | 2 |
| S11 to S14 | 4 |
| S11 to S15 | 5 |
| S12 to S0 | 10 |
| S12 to S1 | 9 |
| S12 to S2 | 5 |
| S12 to S3 | 8 |
| S13 to S4 | 2 |
| S13 to S5 | 1 |
| S13 to S6 | 1 |
| S13 to S7 | 4 |
| S14 to S8 | 18 |
| S14 to S9 | 13 |
| S14 to S10 | 5 |
| S14 to S11 | 4 |
| S15 to S12 | 10 |
| S15 to S13 | 5 |
| S15 to S14 | 1 |
| S15 to S15 | 0. |

4. A disk-drive system, comprising:
a data-storage disk having a surface and operable to store information values;
a motor coupled to and operable to rotate the disk;
a read head operable to generate a read signal;
a read-head positioning assembly operable to move the read head over the surface of the disk;
a Viterbi detector coupled to the read head, operable to receive samples of the read signal, and operable to recover a sequence of the stored information values from the read signal by,
adding only a respective predetermined first constant to each path metric for paths associated with the sequence to generate respective modified path metrics for the paths, the paths terminating at one of a plurality of E²PR4 states associated with the sequence,
comparing the modified path metrics of paths,
selecting the path having the smallest modified path metric,
calculating a branch metric from one or more of the samples, and
adding the branch metric to the modified path metric of the selected path after selecting the path to generate an updated path metric for the one of the E²PR4 states;
wherein the Viterbi detector is further operable to,
add a respective predetermined first constant to each path metric by,
calculating the respective differences between each pair of path metrics for the paths to the one of the E²PR4 states, and
adding a respective predetermined second constant to each of the differences to generate respective modified differences, each predetermined second constant being a combination of the predetermined first constants corresponding to the pair of path metrics for which the respective difference is calculated,
compare the modified path metrics by comparing the modified differences; and
wherein the respective predetermined second constants are selected from the following table:

| E²PR4 States | Second Constants | | | | | |
|---|---|---|---|---|---|---|
| | Ka | Kb | Kc | Kd | Ke | Kf |
| S0 | +5 | +1 | +10 | −4 | +5 | +9 |
| S1 | +3 | +4 | +8 | −2 | +5 | +7 |
| S2 | −3 | −1 | 0 | +2 | +3 | +1 |
| S3 | −5 | −1 | −2 | +4 | +3 | −1 |
| S4 | −3 | −3 | −2 | −0 | +1 | +1 |
| S5 | −5 | −3 | −4 | +2 | +1 | −1 |
| S6 | −11 | −5 | −12 | +6 | −1 | −7 |
| S7 | −7 | −2 | −14 | +8 | −1 | −9 |
| S8 | +9 | +1 | −8 | +14 | +2 | +7 |
| S9 | +7 | +1 | −6 | +12 | +5 | +11 |
| S10 | +1 | −1 | −2 | +4 | +3 | +5 |
| S11 | −1 | −1 | 0 | +2 | +3 | +3 |
| S12 | +1 | −3 | −4 | +2 | +1 | +5 |
| S13 | −1 | −3 | −2 | 0 | +1 | +3 |
| S14 | −7 | −5 | +2 | −8 | −1 | −3 |
| S15 | −9 | −5 | +4 | −10 | −1 | −5. |

5. The disk-drive system of claim 4 wherein each of the information values comprises a respective information bit.

6. The disk-drive system of claim 4 wherein the Viterbi detector:
comprises a surviving-path register corresponding to the one of the E²PR4 states; and
is further operable to load the selected path into the surviving-path register.

7. The disk-drive system of claim 4, wherein the Viterbi detector:
   comprises a path-metric register corresponding to the one of the E²PR4 states; and
   is further operable to load the updated path metric into the path-metric register.

8. The disk-drive system of claim 4, further comprising:
   a read channel that is coupled to the read head, includes the Viterbi detector, and is operable to generate the samples of the read signal; and
   wherein the Viterbi detector is further operable to process two consecutive samples of the read signal at a time and to calculate the modified branch metric from two consecutive samples.

9. A method of recovering a sequence of values from a signal, the method comprising:
   adding only a respective predetermined first signal-independent quantity to each path metric for paths associated with the sequence to one of a plurality of E²PR4 states associated with the sequence to generate respective modified path metrics for the paths;
   identifying as a surviving path the one of the paths having the smallest modified path metric;
   calculating a branch metric from a sample of the signal;
   after identifying the surviving path, adding the branch metric to the smallest modified path metric to generate an updated path metric for association with the one of the E²PR4 states;
   wherein adding a first signal-independent quantity comprises,
      calculating the respective differences between each pair of path metrics for the paths to the one of the E²PR4 states, and
      adding a respective predetermined second signal-independent quantity to each of the differences to generate respective modified differences, each predetermined second quantity being a combination of the predetermined first quantities corresponding to the pair of path metrics for which the respective difference is calculated;
   wherein identifying the surviving path comprises determining from the modified differences which of the modified path metrics is the smallest modified path metric; and
   wherein the respective predetermined second signal-independent quantities are selected from the following table:

| E²PR4 States | Second Signal-Independent Quantities | | | | | |
|---|---|---|---|---|---|---|
| | Ka | Kb | Kc | Kd | Ke | Kf |
| S0 | +5 | +1 | +10 | −4 | +5 | +9 |
| S1 | +3 | +4 | +8 | −2 | +5 | +7 |
| S2 | −3 | −1 | 0 | +2 | +3 | +1 |
| S3 | −5 | −1 | −2 | +4 | +3 | −1 |
| S4 | −3 | −3 | −2 | −0 | +1 | +1 |
| S5 | −5 | −3 | −4 | +2 | +1 | −1 |
| S6 | −11 | −5 | −12 | +6 | −1 | −7 |
| S7 | −7 | −2 | −14 | +8 | −1 | −9 |
| S8 | +9 | +1 | −8 | +14 | +2 | +7 |
| S9 | +7 | +1 | −6 | +12 | +5 | +11 |
| S10 | +1 | −1 | −2 | +4 | +3 | +5 |
| S11 | −1 | −1 | 0 | +2 | +3 | +3 |
| S12 | +1 | −3 | −4 | +2 | +1 | +5 |
| S13 | −1 | −3 | −2 | 0 | +1 | +3 |
| S14 | −7 | −5 | +2 | −8 | −1 | −3 |
| S15 | −9 | −5 | +4 | −10 | −1 | −5. |

10. The method of claim 9, further comprising:
    sampling the signal; and
    calculating the branch metric from two samples of the signal.

11. A Viterbi detector, comprising:
    an input terminal operable to receive a sample of a signal that represents a sequence of values; and
    a recovery circuit coupled to the input terminal and operable to recover the sequence from the signal by,
       adding only a respective predetermined first constant to each path metric for paths associated with the sequence to one of a plurality of E²PR4 states associated with the sequence to generate respective modified path metrics for the paths;
       identifying as a surviving path the one of the paths having the smallest modified path metric,
       calculating a branch metric from the sample,
       adding the branch metric to the smallest modified path metric after identifying the surviving path to generate an updated path metric, and associating the updated path metric with the one of the E²PR4 states; and
    wherein the respective predetermined first constants are selected from the following table:

| E²PR4 Paths | First Constants |
|---|---|
| S0 to S0 | 0 |
| S0 to S1 | 1 |
| S0 to S2 | 5 |
| S0 to S3 | 10 |
| S1 to S4 | 4 |
| S1 to S5 | 5 |
| S1 to S6 | 8 |
| S1 to S7 | 13 |
| S2 to S8 | 4 |
| S2 to S9 | 1 |
| S2 to S10 | 1 |
| S2 to S11 | 2 |
| S3 to S12 | 8 |
| S3 to S13 | 5 |
| S3 to S14 | 9 |
| S3 to S15 | 10 |
| S4 to S0 | 5 |
| S4 to S1 | 4 |
| S4 to S2 | 2 |
| S4 to S3 | 5 |
| S5 to S4 | 1 |
| S5 to S5 | 0 |
| S5 to S6 | 2 |
| S5 to S7 | 5 |
| S6 to S8 | 13 |
| S6 to S9 | 8 |
| S6 to S10 | 2 |
| S6 to S11 | 1 |
| S7 to S12 | 9 |
| S7 to S13 | 4 |
| S7 to S14 | 2 |
| S7 to S15 | 1 |
| S8 to S0 | 1 |
| S8 to S1 | 2 |
| S8 to S2 | 4 |
| S8 to S3 | 9 |

-continued

| E²PR4 Paths | First Constants |
|---|---|
| S9 to S4 | 1 |
| S9 to S5 | 2 |
| S9 to S6 | 8 |
| S9 to S7 | 13 |
| S10 to S8 | 5 |
| S10 to S9 | 2 |
| S10 to S10 | 0 |
| S10 to S11 | 1 |
| S11 to S12 | 5 |
| S11 to S13 | 2 |
| S11 to S14 | 4 |
| S11 to S15 | 5 |
| S12 to S0 | 10 |
| S12 to S1 | 9 |
| S12 to S2 | 5 |
| S12 to S3 | 8 |
| S13 to S4 | 2 |
| S13 to S5 | 1 |
| S13 to S6 | 1 |
| S13 to S7 | 4 |
| S14 to S8 | 18 |
| S14 to S9 | 13 |
| S14 to S10 | 5 |
| S14 to S11 | 4 |
| S15 to S12 | 10 |
| S15 to S13 | 5 |
| S15 to S14 | 1 |
| S15 to S15 | 0. |

12. The Viterbi detector of claim 11 wherein the recovery circuit is operable to identify the surviving path by:
  calculating the respective differences between each pair of the modified path metrics for the paths to the one of the E²PR4 states; and
  determining from the differences which of the modified path metrics is the smallest modified path metric.

13. A Viterbi detector, comprising:
  an input terminal operable to receive samples of a signal that represents a sequence of values;
  a surviving-path register; and
  a recovery circuit coupled to the input terminal and to the register and operable to recover the sequence from the samples by,
    adding only a respective predetermined constant to each path metric for paths associated with the sequence to generate respective modified path metrics for the paths, the paths terminating at one of a plurality of E²PR4 states associated with the sequence,
    comparing the modified path metrics,
    selecting the path having the smallest modified path metric,
    calculating a branch metric from one or more of the samples,
    adding the branch metric to the modified path metric of the selected path after selecting the path to generate an updated path metric for the one of the E²PR4 states, and
    loading the selected path into the surviving-path register; and
  wherein the respective predetermined constants are selected from the following table:

| E²PR4 Paths | First Constants |
|---|---|
| S0 to S0 | 0 |
| S0 to S1 | 1 |
| S0 to S2 | 5 |
| S0 to S3 | 10 |
| S1 to S4 | 4 |
| S1 to S5 | 5 |
| S1 to S6 | 8 |
| S1 to S7 | 13 |
| S2 to S8 | 4 |
| S2 to S9 | 1 |
| S2 to S10 | 1 |
| S2 to S11 | 2 |
| S3 to S12 | 8 |
| S3 to S13 | 5 |
| S3 to S14 | 9 |
| S3 to S15 | 10 |
| S4 to S0 | 5 |
| S4 to S1 | 4 |
| S4 to S2 | 2 |
| S4 to S3 | 5 |
| S5 to S4 | 1 |
| S5 to S5 | 0 |
| S5 to S6 | 2 |
| S5 to S7 | 5 |
| S6 to S8 | 13 |
| S6 to S9 | 8 |
| S6 to S10 | 2 |
| S6 to S11 | 1 |
| S7 to S12 | 9 |
| S7 to S13 | 4 |
| S7 to S14 | 2 |
| S7 to S15 | 1 |
| S8 to S0 | 1 |
| S8 to S1 | 2 |
| S8 to S2 | 4 |
| S8 to S3 | 9 |
| S9 to S4 | 1 |
| S9 to S5 | 2 |
| S9 to S6 | 8 |
| S9 to S7 | 13 |
| S10 to S8 | 5 |
| S10 to S9 | 2 |
| S10 to S10 | 0 |
| S10 to S11 | 1 |
| S11 to S12 | 5 |
| S11 to S13 | 2 |
| S11 to S14 | 4 |
| S11 to S15 | 5 |
| S12 to S0 | 10 |
| S12 to S1 | 9 |
| S12 to S2 | 5 |
| S12 to S3 | 8 |
| S13 to S4 | 2 |
| S13 to S5 | 1 |
| S13 to S6 | 1 |
| S13 to S7 | 4 |
| S14 to S8 | 18 |
| S14 to S9 | 13 |
| S14 to S10 | 5 |
| S14 to S11 | 4 |
| S15 to S12 | 10 |
| S15 to S13 | 5 |
| S15 to S14 | 1 |
| S15 to S15 | 0. |

14. The Viterbi detector of claim 13, further comprising:
  a path-metric register; and
  wherein the recovery circuit is further operable to recover the sequence from the samples by loading the updated path metric into the path-metric register.

15. The Viterbi detector of claim 13 wherein the recovery circuit is operable to process two samples of the signal at a time.

16. The Viterbi detector of claim 13 wherein the recovery circuit is operable to compare the modified path metrics of the paths that terminate at the one of the $E^2PR4$ states by calculating the respective differences between each pair of the modified path metrics.

17. A disk-drive system, comprising:
    a data-storage disk having a surface and operable to store information values;
    a motor coupled to and operable to rotate the disk;
    a read head operable to generate a read signal;
    a read-head positioning assembly operable to move the read head over the surface of the disk;
    a Viterbi detector coupled to the read head, operable to receive samples of the read signal, and operable to recover a sequence of the stored information values from the read signal by,
        adding only a respective predetermined first constant to each path metric for paths associated with the sequence to generate respective modified path metrics for the paths, the paths terminating at one of a plurality of $E^2PR4$ states associated with the sequence,
        comparing the modified path metrics of paths,
        selecting the path having the smallest modified path metric,
        calculating a branch metric from one or more of the samples, and
        adding the branch metric to the modified path metric of the selected path after selecting the path to generate an updated path metric for the one of the $E^2PR4$ states; and
    wherein the respective predetermined first constants are selected from the following table:

| $E^2PR4$ Paths | First Constants |
|---|---|
| S0 to S0 | 0 |
| S0 to S1 | 1 |
| S0 to S2 | 5 |
| S0 to S3 | 10 |
| S1 to S4 | 4 |
| S1 to S5 | 5 |
| S1 to S6 | 8 |
| S1 to S7 | 13 |
| S2 to S8 | 4 |
| S2 to S9 | 1 |
| S2 to S10 | 1 |
| S2 to S11 | 2 |
| S3 to S12 | 8 |
| S3 to S13 | 5 |
| S3 to S14 | 9 |
| S3 to S15 | 10 |
| S4 to S0 | 5 |
| S4 to S1 | 4 |
| S4 to S2 | 2 |
| S4 to S3 | 5 |
| S5 to S4 | 1 |
| S5 to S5 | 0 |
| S5 to S6 | 2 |
| S5 to S7 | 5 |
| S6 to S8 | 13 |
| S6 to S9 | 8 |
| S6 to S10 | 2 |
| S6 to S11 | 1 |
| S7 to S12 | 9 |
| S7 to S13 | 4 |
| S7 to S14 | 2 |
| S7 to S15 | 1 |
| S8 to S0 | 1 |
| S8 to S1 | 2 |
| S8 to S2 | 4 |
| S8 to S3 | 9 |
| S9 to S4 | 1 |
| S9 to S5 | 2 |
| S9 to S6 | 8 |
| S9 to S7 | 13 |
| S10 to S8 | 5 |
| S10 to S9 | 2 |
| S10 to S10 | 0 |
| S10 to S11 | 1 |
| S11 to S12 | 5 |
| S11 to S13 | 2 |
| S11 to S14 | 4 |
| S11 to S15 | 5 |
| S12 to S0 | 10 |
| S12 to S1 | 9 |
| S12 to S2 | 5 |
| S12 to S3 | 8 |
| S13 to S4 | 2 |
| S13 to S5 | 1 |
| S13 to S6 | 1 |
| S13 to S7 | 4 |
| S14 to S8 | 18 |
| S14 to S9 | 13 |
| S14 to S10 | 5 |
| S14 to S11 | 4 |
| S15 to S12 | 10 |
| S15 to S13 | 5 |
| S15 to S14 | 1 |
| S15 to S15 | 0. |

18. The disk-drive system of claim 17 wherein each of the information values comprises a respective information bit.

19. The disk-drive system of claim 17 wherein the Viterbi detector:
    comprises a surviving-path register corresponding to the one of the $E^2PR4$ states; and
    is further operable to load the selected path into the surviving-path register.

20. The disk-drive system of claim 17, wherein the Viterbi detector:
    comprises a path-metric register corresponding to the one of the $E^2PR4$ states; and
    is further operable to load the updated path metric into the path-metric register.

21. The disk-drive system of claim 17, further comprising:
    a read channel that is coupled to the read head, includes the Viterbi detector, and is operable to generate the samples of the read signal; and
    wherein the Viterbi detector is further operable to process two consecutive samples of the read signal at a time and to calculate the modified branch metric from two consecutive samples.

22. The disk-drive system of claim 17 wherein the Viterbi detector is further operable to compare the modified path metrics of the paths that terminate at the one of the $E^2PR4$ states by calculating the respective differences between each pair of the modified path metrics.

23. A method of recovering a sequence of values from a signal, the method comprising:
    adding only a respective predetermined first signal-independent quantity to each path metric for paths associated with the sequence to one of a plurality of $E^2PR4$ states associated with the sequence to generate respective modified path metrics for the paths;
    identifying as a surviving path the one of the paths having the smallest modified path metric;
    calculating a branch metric from a sample of the signal;

after identifying the surviving path, adding the branch metric to the smallest modified path metric to generate an updated path metric for association with the one of the $E^2PR4$ states; and selecting the respective predetermined first signal-independent quantities from the following table:

| $E^2PR4$ Paths | First Signal-Independent Quantities |
|---|---|
| S0 to S0 | 0 |
| S0 to S1 | 1 |
| S0 to S2 | 5 |
| S0 to S3 | 10 |
| S1 to S4 | 4 |
| S1 to S5 | 5 |
| S1 to S6 | 8 |
| S1 to S7 | 13 |
| S2 to S8 | 4 |
| S2 to S9 | 1 |
| S2 to S10 | 1 |
| S2 to S11 | 2 |
| S3 to S12 | 8 |
| S3 to S13 | 5 |
| S3 to S14 | 9 |
| S3 to S15 | 10 |
| S4 to S0 | 5 |
| S4 to S1 | 4 |
| S4 to S2 | 2 |
| S4 to S3 | 5 |
| S5 to S4 | 1 |
| S5 to S5 | 0 |
| S5 to S6 | 2 |
| S5 to S7 | 5 |
| S6 to S8 | 13 |
| S6 to S9 | 8 |
| S6 to S10 | 2 |
| S6 to S11 | 1 |
| S7 to S12 | 9 |
| S7 to S13 | 4 |
| S7 to S14 | 2 |
| S7 to S15 | 1 |
| S8 to S0 | 1 |
| S8 to S1 | 2 |
| S8 to S2 | 4 |
| S8 to S3 | 9 |
| S9 to S4 | 1 |
| S9 to S5 | 2 |
| S9 to S6 | 8 |
| S9 to S7 | 13 |
| S10 to S8 | 5 |
| S10 to S9 | 2 |
| S10 to S10 | 0 |
| S10 to S11 | 1 |
| S11 to S12 | 5 |
| S11 to S13 | 2 |
| S11 to S14 | 4 |
| S11 to S15 | 5 |
| S12 to S0 | 10 |
| S12 to S1 | 9 |
| S12 to S2 | 5 |
| S12 to S3 | 8 |
| S13 to S4 | 2 |
| S13 to S5 | 1 |
| S13 to S6 | 1 |
| S13 to S7 | 4 |
| S14 to S8 | 18 |
| S14 to S9 | 13 |
| S14 to S10 | 5 |
| S14 to S11 | 4 |
| S15 to S12 | 10 |
| S15 to S13 | 5 |
| S15 to S14 | 1 |
| S15 to S15 | 0. |

24. The method of claim 23 wherein identifying the surviving path comprises:

calculating the respective differences between each pair of the modified path metrics for the paths to the one of the $E^2PR4$ states; and determining from the differences which of the modified path metrics is the smallest modified path metric.

* * * * *